(12) United States Patent
Petilli

(10) Patent No.: US 8,379,760 B2
(45) Date of Patent: Feb. 19, 2013

(54) HYBRID HETERODYNE TRANSMITTERS AND RECEIVERS

(75) Inventor: Eugene M. Petilli, Victor, NY (US)

(73) Assignee: Intrinsix Corporation, Marlborough, MA (US)

( * ) Notice: Subject to any disclaimer, the term of this patent is extended or adjusted under 35 U.S.C. 154(b) by 0 days.

(21) Appl. No.: 12/948,200

(22) Filed: Nov. 17, 2010

(65) Prior Publication Data
US 2011/0069784 A1    Mar. 24, 2011

Related U.S. Application Data

(62) Division of application No. 11/208,430, filed on Aug. 19, 2005, now Pat. No. 7,860,189.

(51) Int. Cl.
*H04L 25/34* (2006.01)

(52) U.S. Cl. ........ 375/296; 375/302; 375/307; 455/102; 455/114.1; 455/114.2; 341/144

(58) Field of Classification Search ............... 375/135, 375/146, 295–297, 306–307, 141–142, 150, 375/302; 341/143–144, 147; 455/22, 102, 455/114.1, 114.2
See application file for complete search history.

(56) References Cited

U.S. PATENT DOCUMENTS

| | | | |
|---|---|---|---|
| 4,974,236 A | 11/1990 | Gurcan et al. |
| 5,357,252 A | 10/1994 | Ledzius et al. |
| 5,392,042 A | 2/1995 | Pellon |
| 5,467,294 A | 11/1995 | Hu et al. |
| 5,563,535 A | 10/1996 | Corry et al. |
| 5,608,400 A | 3/1997 | Pellon |
| 5,701,106 A | 12/1997 | Pikkarainen et al. |
| 5,712,628 A | 1/1998 | Phillips et al. |
| 5,715,281 A | 2/1998 | Bly et al. |
| 5,732,330 A | 3/1998 | Anderson et al. |
| 5,760,722 A | 6/1998 | Harris et al. |
| 5,810,930 A | 9/1998 | Eom et al. |
| 5,841,388 A | 11/1998 | Yasuda et al. |
| 5,950,124 A | 9/1999 | Trompower et al. |
| 5,981,428 A | 11/1999 | Mitsuhashi et al. |
| 5,982,313 A | 11/1999 | Brooks et al. |
| 6,005,506 A | 12/1999 | Bazarjani et al. |
| 6,121,910 A | 9/2000 | Khoury et al. |
| 6,148,046 A | 11/2000 | Kerth et al. |

(Continued)

FOREIGN PATENT DOCUMENTS

EP    0999645 A1    5/2000

OTHER PUBLICATIONS

Luschas et al. "A 942 MHz Output, 17.5 MHz Bandwidth,—70dBc IMD3 ΣΔ DAC", IEEE Custom Integrated Circuits Conference, Sep. 2003.*

(Continued)

*Primary Examiner* — Sam K Ahn
*Assistant Examiner* — Sophia Vlahos
(74) *Attorney, Agent, or Firm* — Daly, Crowley, Mofford & Durkee, LLP

(57) ABSTRACT

Disclosed are hybrid heterodyne transmitters and receivers for use in communications systems, or other systems, and the corresponding methods for hybrid heterodyne transmitting and receiving. A heterodyne receiver for converting a continuous time modulated signal to a discrete time digital baseband signal includes a sigma-delta modulator. The sigma-delta modulator is a signal-delta analog-to-digital converter constructed and arranged to receive a modulated signal at an RF carrier frequency and provide a quantized output at a first intermediate frequency. The heterodyne receiver may also include a digital mixer constructed and arranged to receive a data stream quantized by the sigma-delta analog-to-digital converter and receive a signal at a second mixing frequency. The digital mixer then provides digital signals representative of a baseband signal suitable for digital signal processing.

20 Claims, 15 Drawing Sheets

U.S. PATENT DOCUMENTS

| | | | |
|---|---|---|---|
| 6,151,071 | A | 11/2000 | Petilli et al. |
| 6,160,859 | A | 12/2000 | Martin et al. |
| 6,195,539 | B1 | 2/2001 | Galal et al. |
| 6,225,928 | B1 | 5/2001 | Green |
| 6,275,540 | B1 | 8/2001 | Barrett et al. |
| 6,304,608 | B1 * | 10/2001 | Chen et al. ............ 375/252 |
| 6,310,908 | B1 | 10/2001 | Reed et al. |
| 6,329,939 | B1 | 12/2001 | Swaminathan et al. |
| 6,330,290 | B1 | 12/2001 | Glas |
| 6,346,898 | B1 | 2/2002 | Melanson |
| 6,356,594 | B1 * | 3/2002 | Clement et al. ............ 375/261 |
| 6,373,344 | B1 * | 4/2002 | Mar ............ 331/96 |
| 6,381,265 | B1 | 4/2002 | Hessel et al. |
| 6,396,428 | B1 | 5/2002 | Cheng |
| 6,397,051 | B1 | 5/2002 | Abbasi et al. |
| 6,405,022 | B1 | 6/2002 | Roberts et al. |
| 6,420,940 | B1 * | 7/2002 | Minnis et al. ............ 332/103 |
| 6,426,714 | B1 | 7/2002 | Ruha et al. |
| 6,437,718 | B1 | 8/2002 | Oyama et al. |
| 6,459,743 | B1 | 10/2002 | Lipka |
| 6,476,746 | B2 | 11/2002 | Viswanathan |
| 6,539,052 | B1 | 3/2003 | Hessel et al. |
| 6,606,007 | B1 | 8/2003 | Washburn |
| 6,614,856 | B1 | 9/2003 | Meyer |
| 6,631,255 | B1 | 10/2003 | Claxton et al. |
| 6,639,481 | B1 | 10/2003 | Ravi et al. |
| 6,677,875 | B2 | 1/2004 | Dagher et al. |
| 6,697,003 | B1 | 2/2004 | Chen |
| 6,704,558 | B1 | 3/2004 | Sorrells et al. |
| 6,738,003 | B2 | 5/2004 | Melanson |
| 6,738,608 | B2 | 5/2004 | Black et al. |
| 6,765,517 | B1 | 7/2004 | Ali |
| 6,809,669 | B1 * | 10/2004 | Robinson ............ 341/131 |
| 6,864,818 | B1 | 3/2005 | Hezar |
| 6,864,918 | B2 | 3/2005 | Koide |
| 6,961,385 | B2 * | 11/2005 | Plisch et al. ............ 375/259 |
| 6,987,953 | B2 * | 1/2006 | Morris et al. ............ 455/102 |
| 7,031,395 | B2 | 4/2006 | Hinrichs et al. |
| 7,042,960 | B2 | 5/2006 | Kintis |
| 7,068,075 | B2 | 6/2006 | Kintis |
| 7,099,402 | B2 * | 8/2006 | Mollenkopf ............ 375/295 |
| 7,120,203 | B2 | 10/2006 | Bauch et al. |
| 7,129,868 | B2 * | 10/2006 | Ku ............ 341/122 |
| 7,146,144 | B2 * | 12/2006 | Robinson et al. ............ 455/260 |
| 7,193,547 | B2 * | 3/2007 | Ho et al. ............ 341/144 |
| 7,383,296 | B2 * | 6/2008 | Harron et al. ............ 708/271 |
| 7,439,891 | B2 | 10/2008 | Kozak et al. |
| 7,564,892 | B1 * | 7/2009 | Lidstrom et al. ............ 375/211 |
| 7,576,671 | B2 | 8/2009 | Petilli et al. |
| 7,605,653 | B2 | 10/2009 | Kozak et al. |
| 7,612,608 | B2 | 11/2009 | Kozak et al. |
| 7,860,189 | B2 | 12/2010 | Petilli et al. |
| 7,876,855 | B2 | 1/2011 | Kintis |
| 7,953,174 | B2 * | 5/2011 | Asbeck et al. ............ 375/295 |
| 2003/0081803 | A1 | 5/2003 | Petilli et al. |
| 2003/0186671 | A1 | 10/2003 | Prodanov et al. |
| 2004/0192229 | A1 * | 9/2004 | Morris et al. ............ 455/91 |
| 2005/0090219 | A1 | 4/2005 | Kang et al. |
| 2005/0110562 | A1 * | 5/2005 | Robinson et al. ............ 330/10 |
| 2007/0241950 | A1 | 10/2007 | Petilli et al. |

OTHER PUBLICATIONS

San et al. "A Noise-Shaping Algorithm of Multi-bit DAC Nonlinearities in Complex Bandpass ΣΔAD Modulators", IEICE, Apr. 2004.*
H. Tao et al., "A 400 Ms/s Frequency Translating Bandpass Sigma Delta Modulator", IEEE Journal of Solid State Circuits, vol. 34, 12, Dec. 1999, pp. 1741-1752.
Jantzi et al., "A Quadrature Bandpass ΣΔ Modulator for Digital Radio", IEEE International Solid-State Circuits Conference, Feb. 1997.
Hussein et al., "Bandpass ΣΔ Modulator Emplying Undersampling of RF Signals for Wireless Communication", IEEE Transactions on Circuits and Systems II; Analog and Digital Signal Processing, vol. 47, 7, Jul. 2000, pp. 614-620.
Erickson, "Filter Circuits", ECEN2260, Nov. 10, 1997, 11 pages.
Dörrer, et al., "A 3-mW 74-dB SNR 2-MHz Continuous-Time Delta-Sigma ADC With a Tracking ADC Quantizer in 0.13-μm CMOS", IEEE Journal of Solid-State Circuits, vol. 40, No. 12, Dec. 2005, pp. 2416-2427, XP002440494, 12 pages.
GHz Technology and Lucent Technologies to Develop, Manufacture Custom Power Amplifier Transistors for Wireless Base Stations, Business Wire, Aug. 8, 2000, (printed Jan. 13, 2009), 1 page.
Chang et al., "Combined Harley Image-Reject Receiver with Bandpass Delta-Sigma Modulator", Department of Electrical Engineering, The Ohio State University, 1998, 5 pages.
Gao et al., "A 950-MHz IF Second-Order Integrated LC Bandpass Delta-Sigma Modulator", IEEE Journal of Solid-State Circuits, vol. 33, No. 5, May 1998, 10 pages.
Kenney et al., "Design of Multibit Noise-Shaping Data Converters", Analog Integrated Circuits and Signal Processing archive. vol. 3, Issue 3 (May 1993), pp. 259-272.
Paulus et al., "TP 3.2: A CMOS IF Transceiver for Narrowband PCS", Feb. 5, 1998 IEEE International Solid State Circuits Conference, Digest of Technical Papers, p. 46-47.
Wu et al. "Weaver Architecture with Bandpass Delta-Sigma A/D Converters", IEEE, Aug. 1998.
The International Search Report (Form PCT/ISA/210), and the Written Opinion of the International Searching Authority (Form PCT/ISA/237), dated Jul. 13, 2007, 11 pages.
International Preliminary Report on Patentability (Form PCT/IB/373) and Written Opinion (Form PCT/ISA/237) for PCT/US2007/005108, dated Oct. 21, 2008, 6 pages.
The International Search Report (Form PCT/ISA/210), and the Written Opinion of the International Searching Authority (Form PCT/ISA/237), for PCT Application No. PCT/US2005/029560 dated Jan. 26, 2006, 14 pages.
Harrison, et al. A multi-bit sigma-delta ADC with an FIR DAC loop filter, Dept. of Electronics, Macquarie University Marsfield 2109, Australia, 2008, 6 pages.
U.S. 7,860,189, issued Dec. 28, 2010, 466 pages.
U.S. 7,612,608, issued Nov. 3, 2009, 248 pages.
U.S. 7,605,653, issued Aug. 16, 2007, 166 pages.
U.S. 7,439,891, issued Oct. 21, 2008, 99 pages.
U.S. 7,576,671, issued Aug. 18. 2009, 99 pages, 276 pages.

* cited by examiner

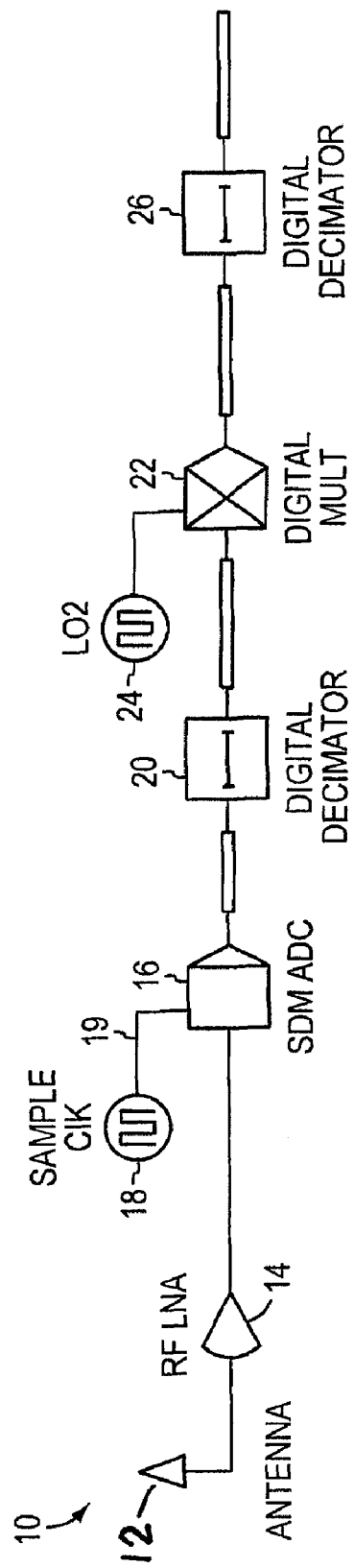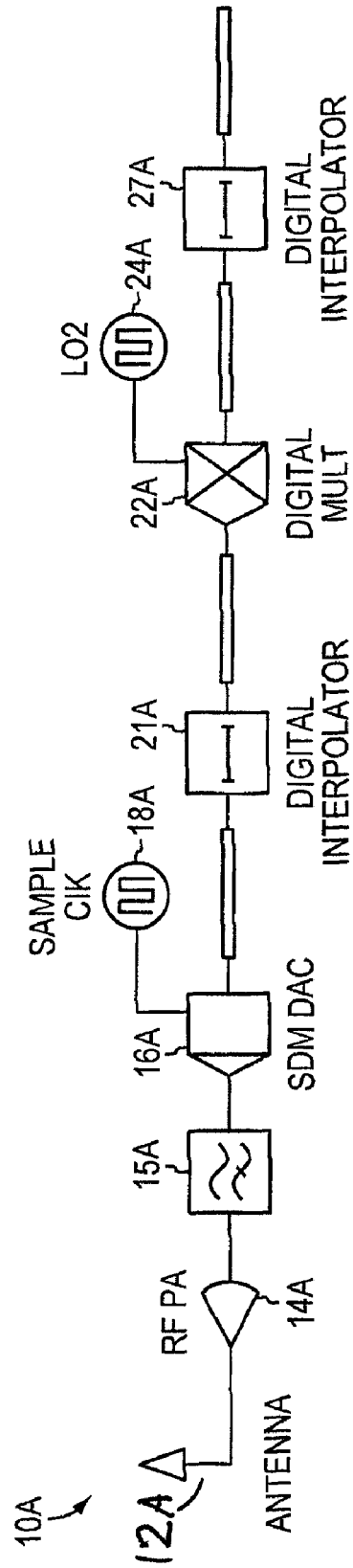

HYBRID HETERODYNE TRANSMITTERS AND RECEIVERS

CROSS-REFERENCE TO RELATED APPLICATION

This application is a divisional of U.S. application Ser. No. 11/208,430, which was filed on Aug. 19, 2005, now U.S. Pat. No. 7,860,189 which is incorporated by reference in its entirety.

FIELD OF THE INVENTION

The present inventions are directed to communications systems and more particularly to hybrid heterodyne transmitters or receivers.

BACKGROUND OF THE INVENTION

Modern communication systems use digital transmission since it provides improved efficiency and the ability to detect and correct transmission errors. There are several digital transmission formats such as binary phase shift keying (BPSK), quaternary phase shift keying (QPSK), offset quaternary phase shift keying (OQPSK), m-ary phase shift keying (m-PSK), orthogonal frequency division modulation (OFDM), and quadrature amplitude modulation (QAM). There are different communication systems such as code division multiple access (CDMA) communication systems, or high definition television (HDTV) systems.

In digital transmission, the digitized data is used to modulate a carrier sinusoid using one of the above-listed formats. The modulated waveform is further processed (e.g. filtered, amplified, and up-converted) and transmitted to a remote station. At the remote station, the transmitted RF signal is received and demodulated by a receiver. A typical receiver includes an antenna that receives the signals and a filter that limits the received signals to the desirable carrier frequency range. The frequency band limited signal received by the antenna is then applied to a low noise amplifier where it is amplified to an amplitude suitable for subsequent processing, as described below.

Wireless telecommunications systems such as cellular telephone communications systems use several base stations that receive and transmit signals over a particular carrier frequency or channel within an allocated frequency band to communicate with a terminal handset. The terminal handset typically tunes to receive one narrow band channel within the wider frequency band at a time while base stations are typically required to tune in multiple channels and communicate with multiple terminals at a time.

In general, communications systems can use several types of RF receivers. A homodyne receiver is perhaps the most basic of RF receivers. The homodyne receiver usually includes a low noise amplifier (LNA) that accepts an RF signal received by an antenna, and amplifies the detected signal. The amplifier provides the amplified signal to an RF filter and to an analog mixer that multiplies the filtered RF signal with an analog mixing signal provided by a frequency generator including a local oscillator (LO). The analog mixer down-converts and recovers the desired baseband signal. (The analog mixing signal may have its frequency tuned for channel selection by a synthesizer.) This homodyne technique is sometimes called a "zero IF" architecture since the RF modulated signal is down-converted directly to zero frequency without an intermediate frequency (IF). In "zero IF" architectures, the LO signal is at the same frequency as the RF receiver signal. The use of the substantially same RF frequency signal (LO) for mixing can have the undesirable effect of the LO signal being radiated out through the antenna. In addition, coupling within the mixer can create a design issue in that the LO appears on the output of the mixer as a large DC offset, potentially jamming the desired signal.

A super-heterodyne receiver is another type of an RF receiver. A super-heterodyne receiver has several advantages over the zero-IF architecture. A super-heterodyne receiver also includes a low noise amplifier and a filter for filtering the modulated amplified RF signal. The receiver uses an analog RF mixer that receives the modulated RF signal for down-converting. The receiver uses a first frequency generator for providing a first mixing signal (LO1) that is offset from the RF carrier by an intermediate frequency (IF). The analog mixer receives the two offset RF signals and provides the modulated output at the IF frequency to a filter (e.g., a surface acoustic wave filter) having a high Q and a narrow band.

In super-heterodyning, the difference between the frequency of the modulated signal and the LO1 signal provides advantageous ability to isolate and filter non-idealities from the desired signal. The high Q and narrow band filter provides the filtered IF signal to a second mixer (usually an analog mixer) operating at the IF frequency. The second mixer also receives a second mixing signal (LO2) provided by a second frequency generator. (The second mixer may be replaced by a modulator that also digitizes the analog signal.) The mixer down-converts the IF frequency signal to a baseband signal suitable for processing. Usually, this architecture provides the signal of interest at the frequency RF+/−IF, and an image signal at RF−/+IF. Therefore, the receiver performs image rejection using a surface acoustic wave (SAW) filter. Alternatively, the receiver may use Weaver mixer architecture to remove the unwanted image. The Weaver mixer architecture separates the modulated signal into an in-phase (I) signal and a quadrature (Q) signal to perform the mixing separately for the I & Q signals. This is done in two stages further separating each signal into two 90° shifted signals for mixing down to a baseband frequency. The baseband signals are combined by first appropriately shifting the phase.

There is still a need for communications systems and other systems that use hybrid heterodyne transmitters or receivers.

SUMMARY OF THE INVENTION

The present inventions are directed to hybrid heterodyne transmitters or receivers for use in communications systems or other systems. The present inventions are also directed to methods for hybrid heterodyne transmitting or receiving for use in communications systems or other systems.

According to one aspect, a heterodyne receiver for converting a continuous time modulated signal to a discrete time digital baseband signal includes a sigma-delta modulator and a digital mixer. The sigma-delta modulator is a sigma-delta analog-to-digital converter constructed and arranged to receive a modulated signal at an RF carrier frequency and provide a quantized output at a first intermediate frequency. The digital mixer is constructed and arranged to receive a data stream quantized by the sigma-delta analog-to-digital converter and receive a signal at a second mixing frequency. The digital mixer is constructed to provide digital signals representative of a baseband signal suitable for digital signal processing.

Preferably, the heterodyne receiver may include an analog frequency generator, including a local oscillator, constructed to provide a mixing signal being less than twice the RF frequency, wherein the sigma-delta analog-to-digital converter includes a sampler such as a mixer for receiving the analog mixing signal and providing an output signal at the first intermediate frequency.

The sigma-delta analog-to-digital converter is arranged to receive an analog sampling signal from the analog frequency generator. The sigma-delta analog-to-digital converter is arranged to receive an analog sampling signal at a frequency providing over-sampling with respect to the first intermediate frequency. The sigma-delta analog-to-digital converter is arranged to receive, from the analog frequency generator, an analog sampling signal at a frequency providing over-sampling with respect to the first intermediate frequency.

The heterodyne receiver may further include a digital frequency generator constructed an arranged to provide the signal at a second mixing frequency, the second mixing frequency being comparable to the first intermediate frequency. The heterodyne receiver may further include a digital frequency generator constructed and arranged to provide selectable frequency signals used as the signal at the second mixing frequency, the second mixing frequency being comparable to the first intermediate frequency.

According to another aspect, a modulated signal receiver includes a means for receiving a plurality of modulated signals, a means for generating a plurality of local oscillator (LO) signals with frequencies less than twice the carrier frequency of the modulated signals, and an over-sampled data converter. The over-sampled data converter is constructed to receive the modulated signals and the LO signals, and includes means for down-converting the modulated signals before quantization. The over-sampled data converter also includes a means for generating a plurality of quantized signals responsive to the down-converted signals, and a means for performing noise-shaping utilizing a plurality of poles in the modulated frequency band and a plurality of poles in the down-converted frequency band.

According to preferred embodiments, this modulated signal receiver may further include within the over-sampled data converter a means, responsive to the quantized signal, for generating a plurality of feedback signals, and a plurality of summing means responsive to the modulated inputs and the feedback signals for closing the over-sampled converter loop. The feedback means may include a plurality of single bit digital-to-analog converters (DACs). The feedback means may include a multi-bit DAC with Dynamic Element Matching (DEM). The over-sampled converter may be a noise shaping Sigma-Delta converter. The over-sampled converter may include a complex sigma-delta modulator (SDM), responsive to provided in-phase (I) and quadrature (Q) modulated input signals.

According to yet another aspect, a heterodyne transmitter for converting a discrete time digital baseband signal to a continuous time modulated signal includes a digital mixer and a sigma-delta digital-to-analog converter. The digital mixer is constructed and arranged to receive a digital data stream processed by a digital signal processor and receive a digital signal at a mixing frequency, wherein the digital mixer is constructed to provide digital signals at an intermediate frequency being representative of a baseband signal. The sigma-delta digital to analog converter is constructed and arranged to receive digital signals at the intermediate frequency and provide a modulated signal at an RF carrier frequency.

According to yet another aspect, a method of generating a plurality of quantized signals includes receiving a plurality of modulated signals, and generating a plurality of local oscillator (LO) signals with frequencies less than twice the carrier frequency of the modulated signals. The method also includes receiving the modulated signals and the LO signals, down-converting the modulated signals before quantization; generating a plurality of quantized signals responsive to the down-converted signals, and performing noise-shaping utilizing a plurality of poles in the modulated frequency band and a plurality of poles in the down-converted frequency band. The noise-shaping may be performed during the converting.

The method may also include generating a plurality of feedback signals responsive to the quantized signal, and summing the feedback signals to close over-sampled loop converting. The input signals may include of a plurality of in-phase (I) and out-of-phase (Q) signals having carriers 90 degrees out of phase with respect to each other. The method may include changing the noise shaping to modify receiver bandwidth and sensitivity.

Furthermore, this present invention relates to a method and apparatus for converting a continuous time modulated signal to/from a discrete time digital baseband signal. Preferred embodiments utilize a sigma-delta modulator (SDM) replacing a traditional analog mixer by substituting the local oscillator (LO) input to the mixer with the sample clock input to the SDM. This undersamples the modulated signal while it simultaneously over-samples the desired baseband information bandwidth. If the sample clock is chosen such as to create an intermediate frequency (IF) carrier, a second mixing function may be performed on the digital SDM output by a digital multiplier, thereby creating a hybrid analog/digital receiver or a "digital heterodyne" receiver. The receiver may generate quadrature outputs using either a complex SDM or two SDMs with a phase shift network on the RF input, or by utilizing quadrature sample clocks to the two SDMs. The transmitter is designed to complement the receiver as described below.

The present invention improves system manufacturability and performance by replacing analog/RF components with digital mode devices such as those used in Sigma-Delta data converters. The over-sampling SDM ADC clock is intentionally chosen to be less than twice the carrier frequency, in clear violation of Nyquist sampling criteria, to create an aliased signal at a frequency equivalent to a traditional RF down-converting mixer. Either high side or low side mixing can be realized as long as the sample clock is less than twice the carrier frequency.

BRIEF DESCRIPTION OF THE DRAWINGS

FIG. 1A is a block diagram of a digital heterodyne receiver.
FIG. 1B is a block diagram of a digital heterodyne transmitter.

DESCRIPTION OF THE PREFERRED EMBODIMENTS

Figure 1C:
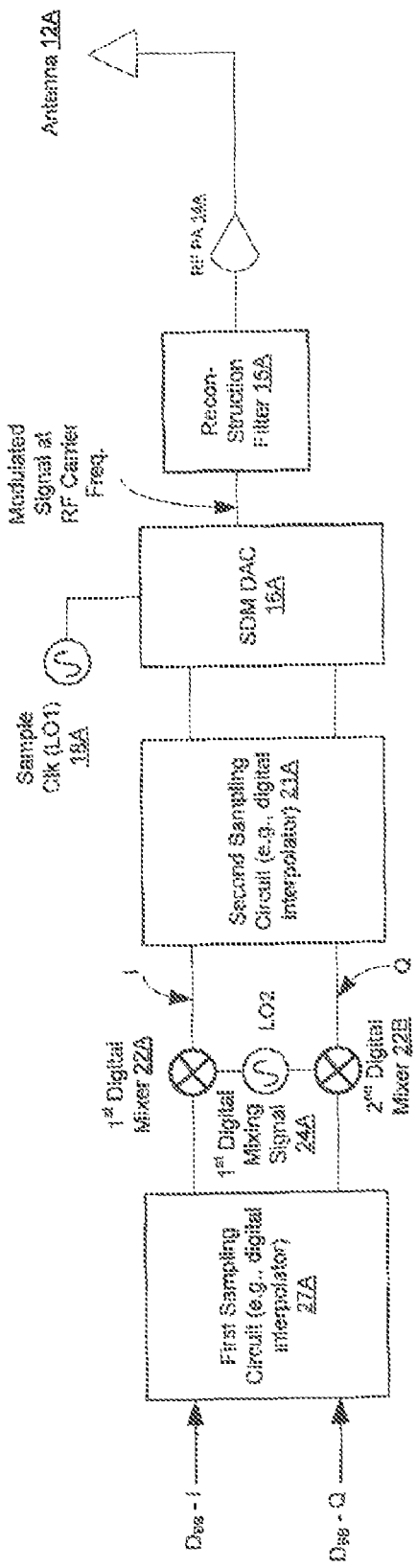
FIG. 1C is a block diagram of a digital heterodyne transmitter showing both the I and Q channels.

FIG. 1A illustrates schematically a digital heterodyne receiver 10. Digital heterodyne receiver 10 includes a low noise RF amplifier 14, a sigma-delta modulator analog-to-digital converter (SDM ADC) 16, digital decimators 20 and 26, and a digital multiplexer 22. Sigma-delta modulator 16 receives the modulated RF signal and provides a digitized output at the RF frequency (for example, several protocols such as Bluetooth and IEEE 802.11b utilize the 2.4 GHz ISM band where f=2.4 GHz), which enables the replacement of analog RF components with digital components.

The transmitted signal is detected by an antenna 12 and the analog RF signal is provided to LN amplifier 14, which amplifies the RF signal and provides it to SDM ADC 16 for modulation, down-conversion and digitalization. SDM ADC 16 receives a sample clock signal 19 from a frequency generator circuit 18 providing the sample clock at a frequency offset from the carrier frequency by a selected intermediate frequency (IF). For the ISM band example, a 2.376 GHz clock would generate a digital IF of 2.4 GHz-2.376 GHz or 24 MHz. The mixing frequency is preferably fixed to enable a low noise construction of the frequency generator. The output of SDM ADC 16 is a digitized signal at the intermediate frequency that could be compared to a mixed-signal equivalent of a super-heterodyne receiver. Typically, the IF is chosen to be between 0 Hz and the signal information bandwidth. Device noise such as 1/f and shot noise as well as DC LO leakage often affect the IF selection and may limit the low side of the range to about 1 MHz. The digitized signal is provided to digital decimator 20, which removes quantization noise and provides anti-aliasing, as described in more detail below. This signal is provided to digital multiplexer 22, which also receives a mixing signal (i.e., a digital sine wave signal) from a digital frequency generator 24, which serves as the second LO2 of the heterodyne receiver. This digital sine wave signal is generated, for example, by using lookup tables, a numerically controlled oscillator (NCO), or by Cordic techniques. Digital multiplexer 22 provides a down-converted output to digital decimator 26. Digital decimator 26 provides the digital signal to a digital signal processor (DSP).

At the RF frequency, the sample clock signal 19 oversamples the baseband signal and the over-sampling SDM ADC clock is selected to be at less than twice the carrier frequency, in clear violation of Nyquist sampling criteria, to create an aliased signal at a frequency equivalent to a traditional RF down-converting mixer. The high side or low side mixing can be realized as long as the sample clock is less than twice the carrier frequency. In digital multiplexer 22, the digital IF output of SDM data converter 16 is mixed (multiplied) with the digital representation of digital oscillator 24 to affect channel selection, and to create a digital representation of the baseband signal. Since digital oscillator 24 provides a programmable frequency output signal, the frequency of the sample clock 18 may be fixed.

The use of the fixed frequency simplifies the design of frequency generator circuit 18 and potentially reduces phase noise. The low phase noise in frequency generator circuit with low phase noise is important since SDM performance is often limited by the sample clock jitter. This may improve frequency isolation in frequency shift keying (FSK) as used in communication methods like binary frequency shift keying (BFSK), quadrature phase frequency shift keying (QPFSK), and continuous phase frequency shift keying (FSK).

Another embodiment of digital heterodyne receiver 10 includes a polyphase filter receiving an amplified RF signal from LNA 14 and generating RF in-phase (I) and RF quadrature (Q) signals delivered to two SDMs. This arrangement provides for a quadrature SDM and has the added benefit that both the digital I and Q SDM outputs are available on the same clock edge, thus simplifying the digital timing re-synchronization at the digital mixer operating at the frequency of LO2. For improved image rejection and/or improved dynamic range, the I and Q outputs from the SDMs can be combined into a single complex SDM. Most complex implementations use a band-pass SDM as described for example by Jantzi in "Quadrature Bandpass SDM for Digital Radio," published in IEEE JSSC Vol. 32: No. 12 in December 1997, which is incorporated by reference (hereinafter "Jantzi").

FIG. 1B illustrates schematically a digital heterodyne transmitter 10A, and FIG. 1C illustrates a digital heterodyne transmitter 106 that is essentially the same as the transmitter 10A, but further illustrating the I and Q channels. Referring to FIGS. 1B and 1C, the digital heterodyne transmitters 10A and 10B each include[s] digital interpolators 21A and 27A, digital mixer 22A (which in some embodiments is a multiplexer 22A and which, in the embodiment of FIG. 1C, comprises both digital mixer 22A for the I channel and digital mixer 226 for the Q channel), a sigma-delta modulator digital-to-analog converter (SDM DAC) 16A, reconstruction filter 15A, and an RF power amplifier 14A[15]. For example, digital interpolator 27A receives a digitalized voice signal from a DSP and provides the output to digital mixer 22A (including, if there is both I and Q processing as in FIGG. 1C, providing the I output to digital mixer 22A and the Q output to digital mixer 228), which also receives input from a digital oscillator 24A. As described above, digital oscillator 24A provides a programmable frequency output signal, wherein the frequency of the sample clock is selected for a particular communication channel. Digital interpolator 21A receives the output of digital mixer 22A (and, if applicable, the output of digital mixer 228), which is a digitized signal at an intermediate carrier frequency. (Depending on the specific embodiment, the digital radio frequency signal may include digitized in-phase (I) and quadrature (Q) signals initially generated by the DSP, as illustrated in FIG. 1C). SDM DAC 16A receives the interpolated signal from interpolator 21A signal and a clock signal from oscillator circuit 18A. Oscillator circuit 18A is preferably designed to generate fixed frequency low phase noise signal.

Digital interpolator 21A and 27A are designed to up sample the low clock rate input signal such as to remove aliased versions of the desired signal inherent in the original input signal. This new higher clock signal still has aliases, but they are at a larger offset from the input signal and are therefore more easily filtered later by reconstruction filters.

SDM DAC 16A provides an analog RF signal that may be filtered to remove the noise moved outside the communication band by the sigma delta modulation process. A reconstruction filter 15A, for example an LC tank or a surface acoustic wave filter, filters the RF analog signal and provides it to an RF power amplifier 14A. The amplified RF signal is transmitted by antenna 12A.

Figure 2:
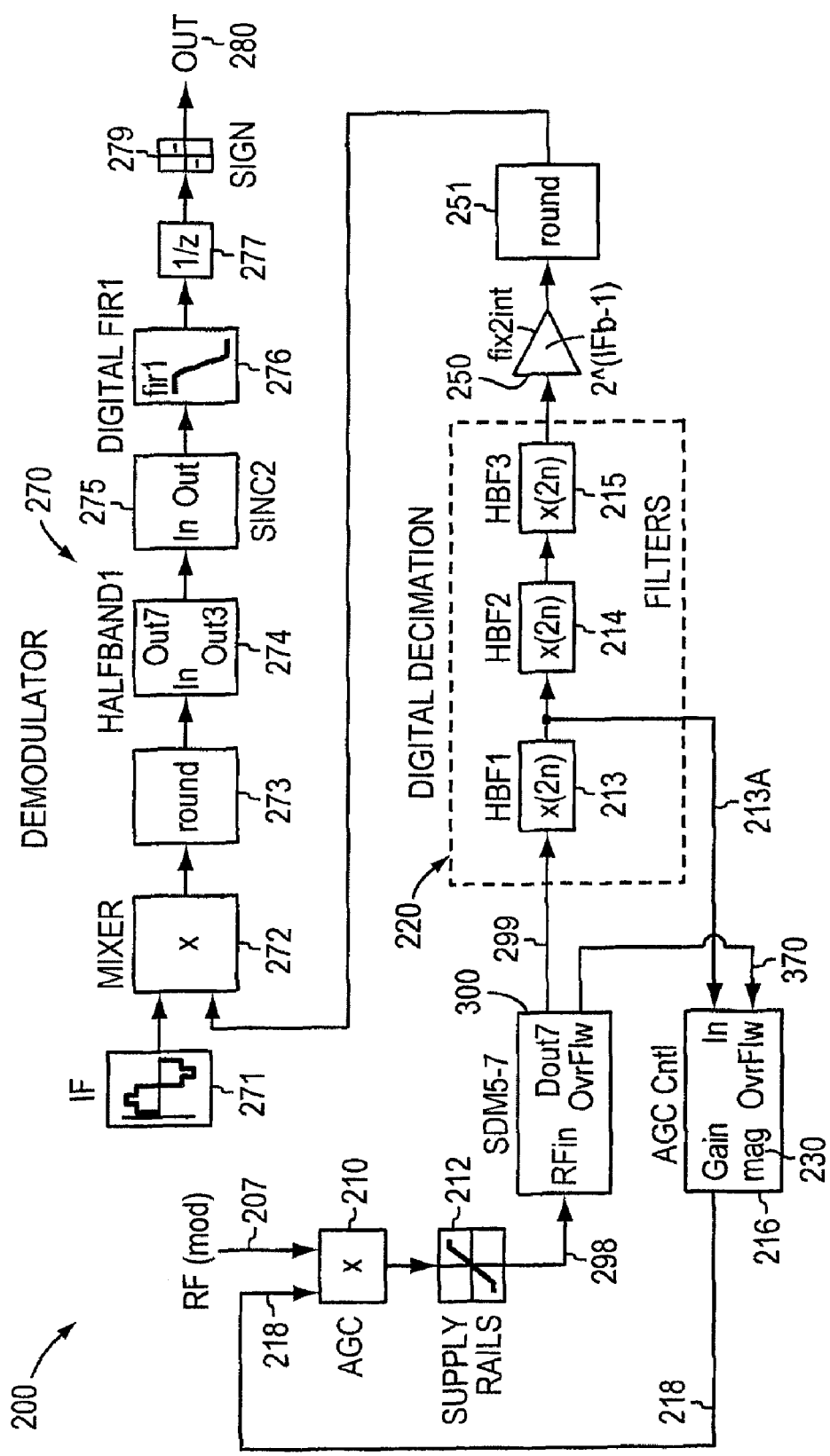
FIG. 2 is a more detailed block diagram of a digital heterodyne receiver shown in FIG. 1A.

FIG. 2 is a block diagram of a multi-standard, multi-band digital heterodyne receiver 200. Digital heterodyne receiver 200 includes a sigma-delta modulator 300, digital decimation filters 220, a demodulator 270, and other elements described below. Sigma-delta modulator 300 is shown in detail in FIG. 2A. Digital heterodyne receiver 200 is designed to oversimple the information bandwidth and undersample the RF signal.

Referring still to FIG. 2, digital heterodyne receiver 200 receives modulated signal 207 provided to automatic gain controller (AGC) 210, which provides at its output the product of the input signal 207 and first stage output 218 from automatic gain controller (AGC) 216, as described below. The output of AGC 210 is fed to an optional limiter 212 (i.e., supply rails 212), where the output amplitude is clipped or clamped up to supply rail voltage levels and is provided to sigma-delta modulator 300. Automatic gain controller 216 adjusts the gain control signal 218 such that the RF signal 298 has the amplitude that matches the desired A/D range and thus limiter 212 do not clip the signal. Otherwise, limiter 212 protects SDM 300.

The output signal from SDM 300 (signal 299) is provided into the input of half band decimation filters (HBF) 213, 214 and 215, which are connected in series, resulting in frequency division by $8=2^3$, and producing the IF signal at 297 MSPS. The order of each HBF with length N may be decided for each filter. In general, the order will increase as the sample rate is reduced due to the smaller transition band for the filter. Other decimation filters such as sinc or comb may be used. The values of transfer functions and coefficient gains are selected to meet specific application requirements.

Figure 2A:
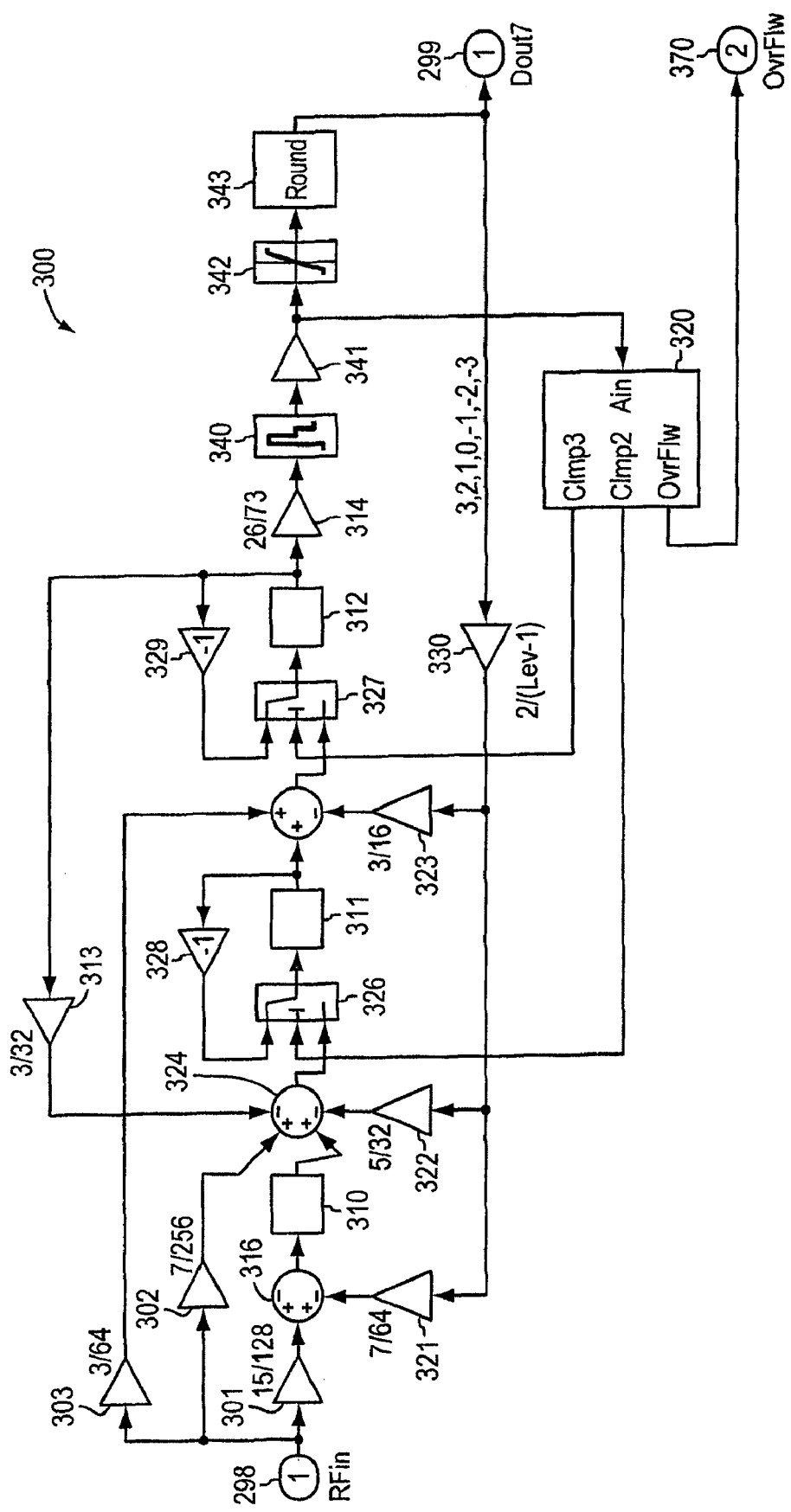
FIG. 2A is a detailed block diagram of a sigma-delta modulator used in the digital heterodyne receiver of FIG. 2.

Referring to FIG. 2A, third order continuous time sigma-delta modulator 300 quantizes the input signal into digital signal outputs and output levels. The output enables the separation of three signal channels, C1, C2 and C3, using overflow level logic control 320. Sigma-delta modulator 300 includes three integrators, 310, 311 and 312, each having a selected transfer function designed to successively provide higher frequency noise shaping and combine the produced Noise Transfer Function (NTF) to meet the application requirements, where the subscript j=1, 2, 3 for each of the three filters 310, 311 and 312, and where the coefficients $a_j$ are different for each filter. In the current embodiment, IFb=14, a1=2.3457, a2=2.0000, a3=1.1447, gm=0.000272, dcg=140, where Ifb is the effective number of bits in the digital IF signal, ai is the resultant gain of the three integrator stages (gm/C), and dcg is the practical circuit limitation on the DC gain of each gm stage.

Sigma-delta modulator 300 also includes a zero order sample-and-hold element 340 for enabling the quantization. The sample rate is chosen similarly to a LO1 in a traditional radio receiver to be offset from the RF frequency by a relatively small IF frequency. The resultant sample frequency of the sample-and-hold should be less than twice the input RF frequency and therefore less than the Nyquist frequency. The sample rate also defines the SDM over sample ratio (OSR=Fs/(2*BW)) with respect to the desired baseband signal bandwidth.

The quantized output of sample-and-hold 340 is further conditioned through amplifier 341, bounded in amplitude by upper/lower bounds block 342. The output level is rounded to the nearest integer level through round 343. The quantized output levels occupy levels labeled [3, 2, 1, 0, −1, −2, −3] which are equally spaced over the expected signal dynamic range (e.g., 1V peak-to-peak), i.e., equal intervals of $\frac{1}{3}^{rd}$ of a volt. The output from 341 is additionally provided to overflow logic controller 320. Depending on the overflow level, the outputs Clmp2 and Clmp3 set the switch conditions on switches 326 and 327. Gain amplifiers 328 and 329 provide gains of −1, thereby eliminating the signal from those channels when switches 326 and 327 are set to connect to the outputs of unity-gain inverting amplifiers 328 and 329, respectively. This occurs when the output level is zero from amplifier 314.

The present SDM eliminates issue of stability present with prior art Sigma-Delta Modulators over second order. The present system monitors the digital output of the SDM and if the output stays max positive or max negative for three cycles in a row, an overflow is declared. The overflow logic states are determined from the input level in logic control 320. If an overflow is detected, the internal integrators are reset by shorting the output back to the input that puts the modulator back into a valid state.

The overflow logic signal from the overflow logic 320 additionally enables the overflow condition to be used to control the gain in automatic gain control 216. Normally, the AGC uses a digital absolute value to rectify the signal followed by a very low frequency filter to extract the average signal level and adjust the output gain signal to obtain the target DC value. The loop frequency response is kept slow, or disabled as not to effect the desired receiver signal. When the overflow bit is high, the gain is decreased at a more aggressive rate, to reduce the overflow and bring the signal back into range of the SDM ADC.

Referring still to FIG. 2, digital heterodyne receiver 200 uses amplifier 250 for amplifying the signal amplitude that is significantly reduced after passing through sigma-delta modulator 300 and decimation filters 213, 214, 215. In amplifier 250, the signal has IFb bits, and therefore a dynamic range of $2^{(IFb-1)}$.

Figure 2B:
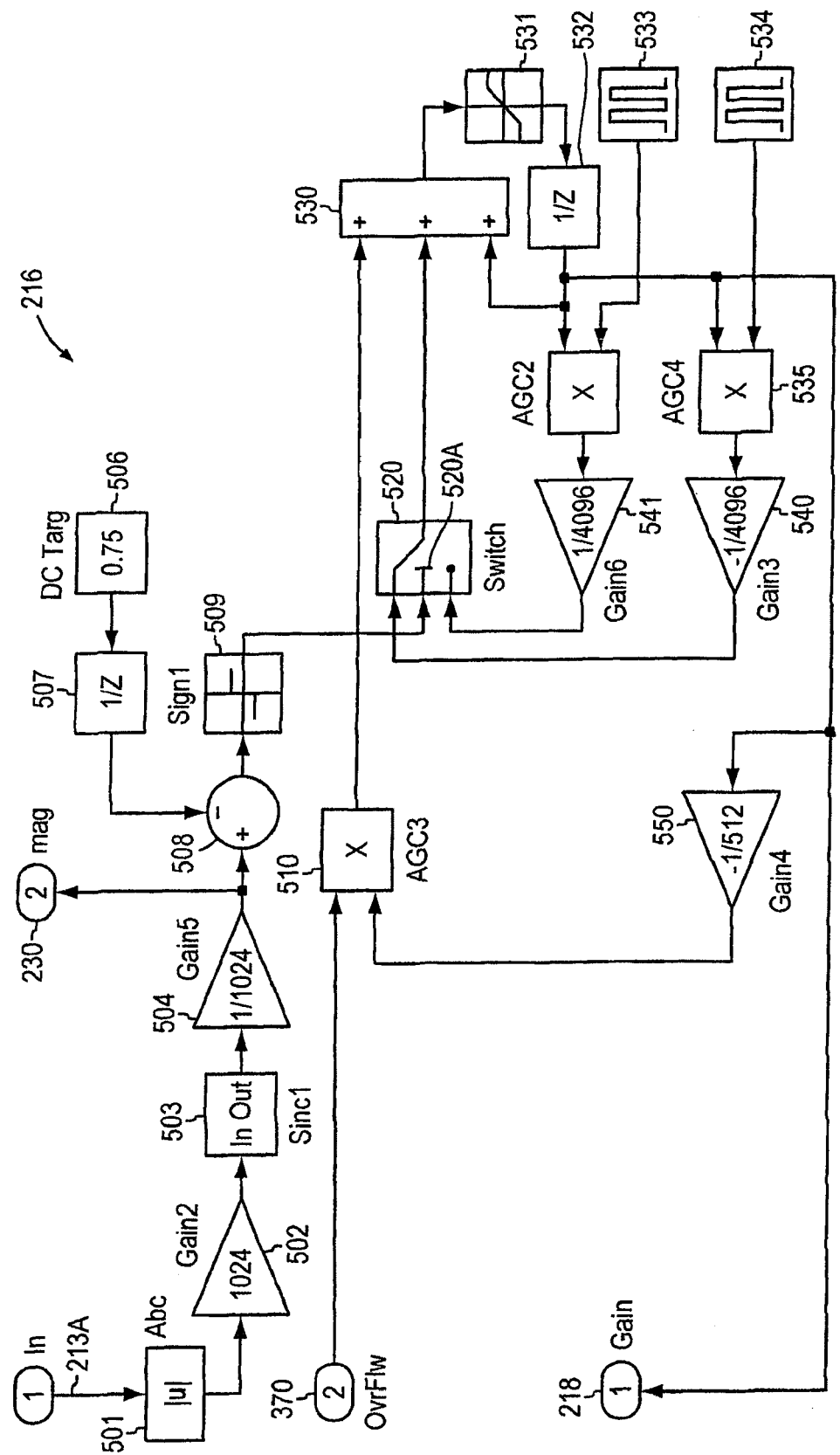
FIG. 2B is a detailed block diagram of an automatic gain control used in the digital heterodyne receiver of FIG. 2.

FIG. 2B is a detailed block diagram of an automatic gain control AGC 216 (also shown in FIG. 2). Automatic Gain Control 216 ensures that the level of the final digital output signal is within digital data range after decimation through decimators HBF1 through HBF3 (shown in FIG. 2). To achieve this, the output of the SDM 300 is provided to overflow logic 320 (FIG. 2A) in SDM 300 (FIG. 2A), which detects the digital overflow. The digital overflow signal 370 (FIG. 2B) is fed to the AGC, which provides a signal to remove or add pulses in the multiplier 510.

The core of AGC 216 is the adder 530. The overflow signal 370 is added to the signal from a gain amplifier 541, or subtracted from the signal from a gain amplifier 540, as determined from the switch signal at input 520A. Additionally, the overflow signal is modified in multiplier 510 according to the output of multiplier 510, and also the one-interval delayed signal from a unit delay 532. Unit delay 532 of the added signal provides a means of preventing under-compensation or overcompensation of the overflow by preventing repeat applications of the same overflow signal. The output of the multipliers AGC2 and AGC4 (535) is controlled from the output of summer 530 and the inputs from signal generators. A limiter 531 clips the output levels to the specified limits.

The switch signal 520A is derived from the first stage decimator 213 (HBF1 shown in FIG. 2). The absolute magnitude of the signed integer input from 213 is taken in Abc 501. The series of amplifiers and synchronization blocks 502, 503 and 504 represents a unity gain amplifier and makes up for former delays: this effectively advances the signal 230 (RF1 displayed in the figure below). Amplifier 502 provides a gain to the input of 503 to enhance signal level, while 504 returns the signal to the appropriate output level for the magnitude signal 230 and input to the multiplexer Shown in FIG. 2B. The signal 230 is indicated in connection with RF1. The sign of the signal is recovered through blocks 506 through 509. A DC level is set in 506, followed by a delay. The adder 508 actually subtracts the DC level, and hence, if the output from 504 is below the level set in 506, the output of 509 is negative, while if the signal from 504 is greater than or equal to 506, the signal output from 509 is positive. As indicated earlier, the output of 509 controls whether the summer adds or subtracts digital input through switch 520, by providing the controlling signal at the port 520A. As shown in FIG. 2, the delayed output from AGC 216 is provided as input to multiplier 210 to adjust the digital gain.

Referring again to FIG. 2, after decimation in decimator 200 (using decimation filters 213, 214, 215), the digital signal from amplifier 250 is rounded down to the nearest integer level in round 251 provided to demodulator 270. Demodulator 270 includes a local fixed oscillator signal 271 providing an IF mixing frequency that is mixed with the IF conditioned signal in mixer 272. The product output signal from mixer 272 is rounded (unit 273) and passed through a half band filter 274 to remove the higher sideband for the super-heterodyne function. It is then additionally conditioned in 275 to provide an oversampled signal to FIR filter 276 (finite input response filter 276). The low pass FIR filter 276 removes the up-shifted modulated noise.

Unit delay 277 delays its input by the specified sample period, and this is equivalent to the z−1 discrete-time operator. Delay 277 accepts input from FIR filter 276 and generates an output, which can be either both scalar or both vector. For the vector input, all elements of the vector are delayed by the same sample period. The output is provided to a digital demodulator 279, which may be as simple as detecting the sign of the signal. Sign block 279 provides the sign of the input so that the output is 1 when the input is greater than zero, the output is 0 when the input is equal to zero, and the output is −1 when the input is less than zero. Demodulated output signal 280 is provided at the base band.

Figure 1D:
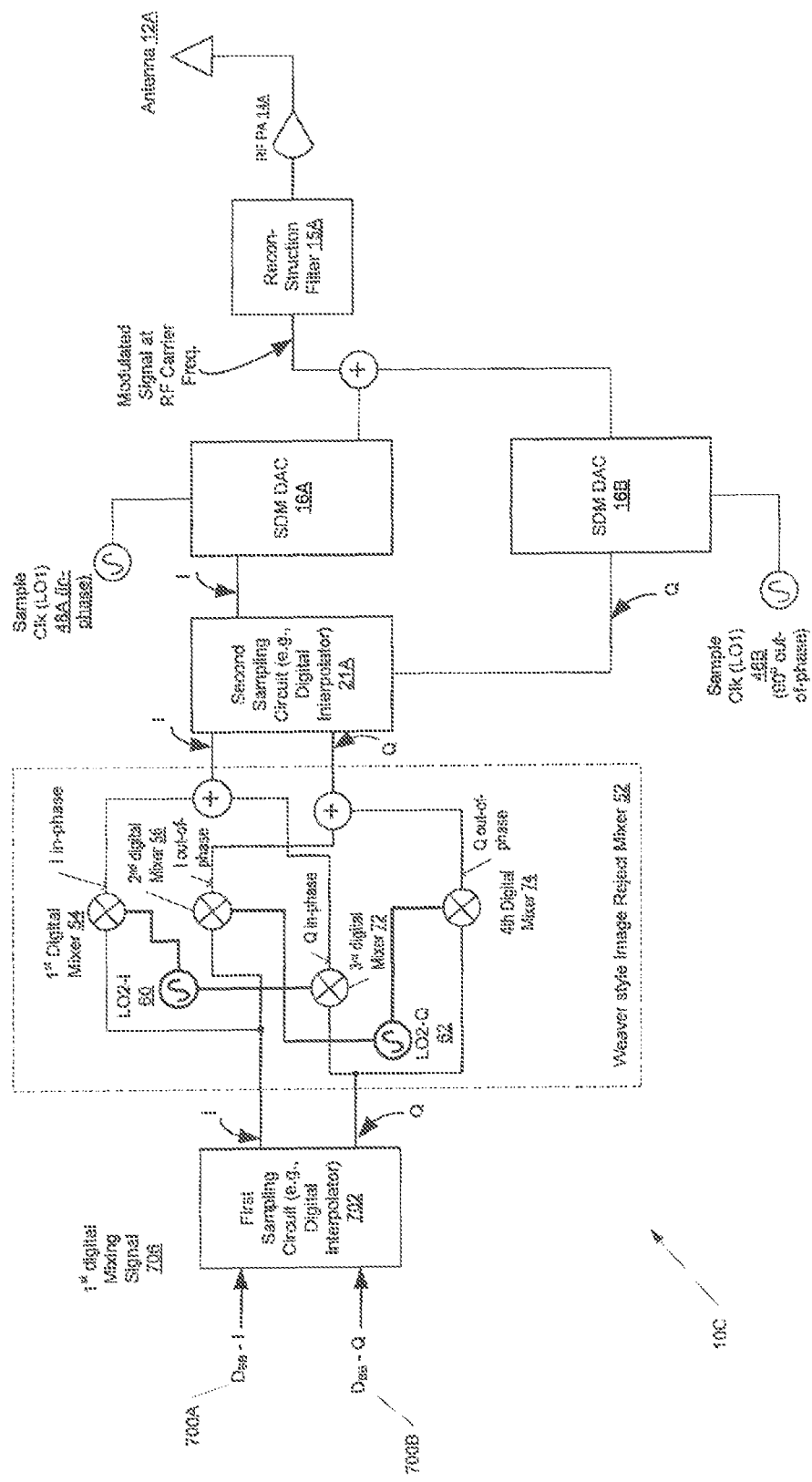
FIG. 1D is a block diagram of a digital heterodyne transmitter that incorporates Weaver image rejection.

Referring again to FIG. 1B, in general, transmitter 10A may include various types of Digital to Analog converters and modulators designed to generate the transmitted RF communication signal. Preferably, transmitter 10A includes a quadrature sigma-delta modulator digital-to-analog converter for simultaneously processing the in-phase (I) and quadrature (Q) signals. Alternately, as shown in FIG. 1D and in FIG. 5, a mixed-signal super-heterodyne transmitter can include two SDMs (16A, 16B in FIG. 1D; 420 and 422 in FIG. 5) and four digital mixers (54, 56, 72, 74 in FIG. 1D; 414, 408, 406, 412 in FIG. 5) to create a digital version of the traditional Weaver image reject mixer architecture (e.g., 52 in FIG. 1D). The Weaver architecture receives an RE modulated input (e.g., 700A, 700B in FIG. 1C; 404, 402 in FIG. 5) to be effectively sampled in quadrature. This sampling is performed, for example, using two oscillator signals ($LO1_I$ and $LO1_Q$) (e.g., 60, 62 of FIG. 1D, or via the signals from numerically controlled oscillator (NCO) 410 of FIG. 5, as described further herein) shifted 90 degrees out of phase, often generated using an oscillator circuit running four times faster than the LO1 signal.

Figure 2C:
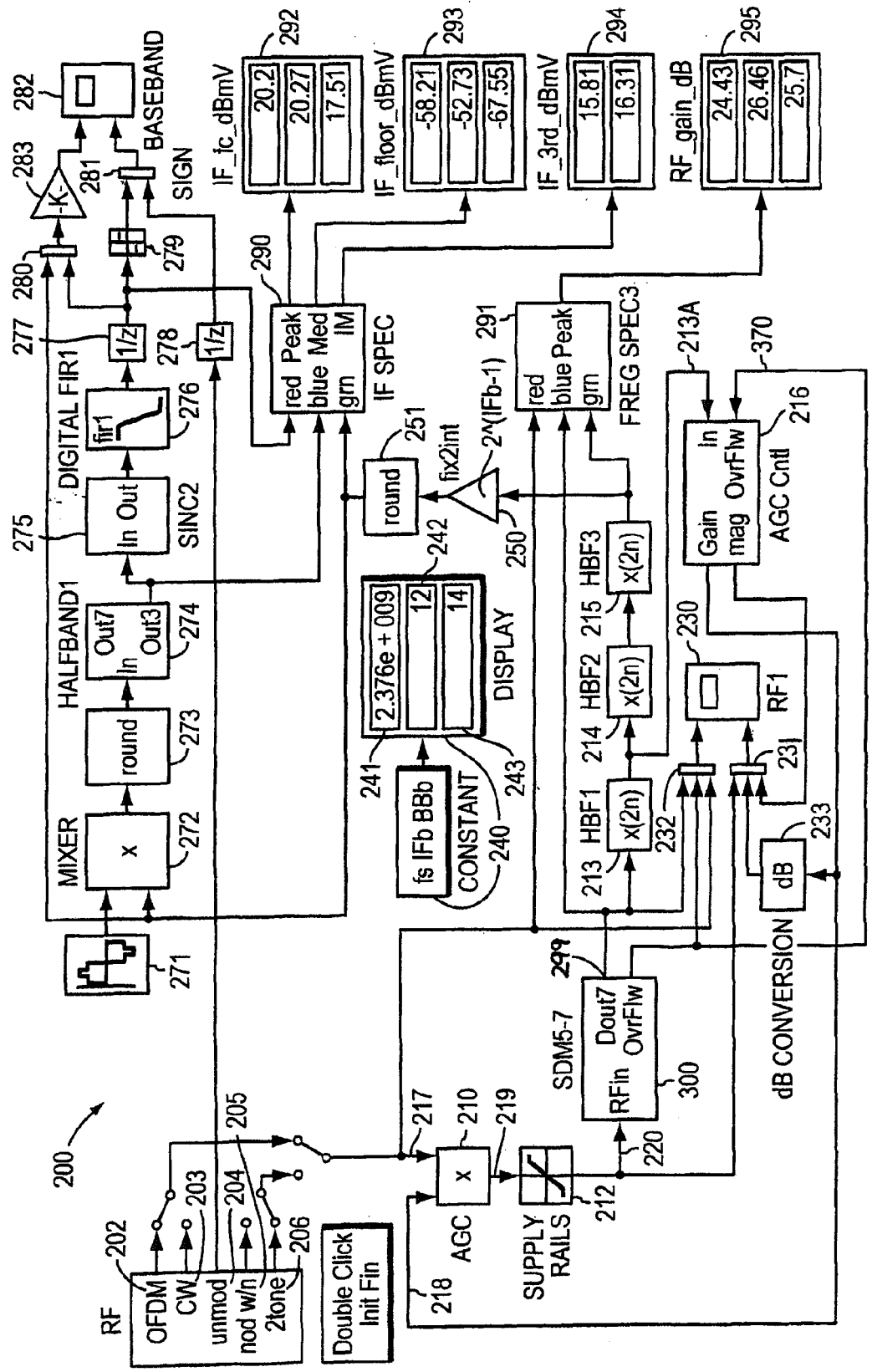
FIG. 2C provides a diagram of a simulation of the digital heterodyne receiver shown in FIG. 2 using Simulink® software.

FIG. 2C is a diagram of a simulation of the digital heterodyne receiver shown in FIG. 2 using Simulink® software. The input signals are signals 202, 203, 204, 205, and 206. An oscilloscope 282 displays the comparison of the original unmodulated signal and the recovered signal (i.e., signal received from sign 279 after processing).

Figure 2D:
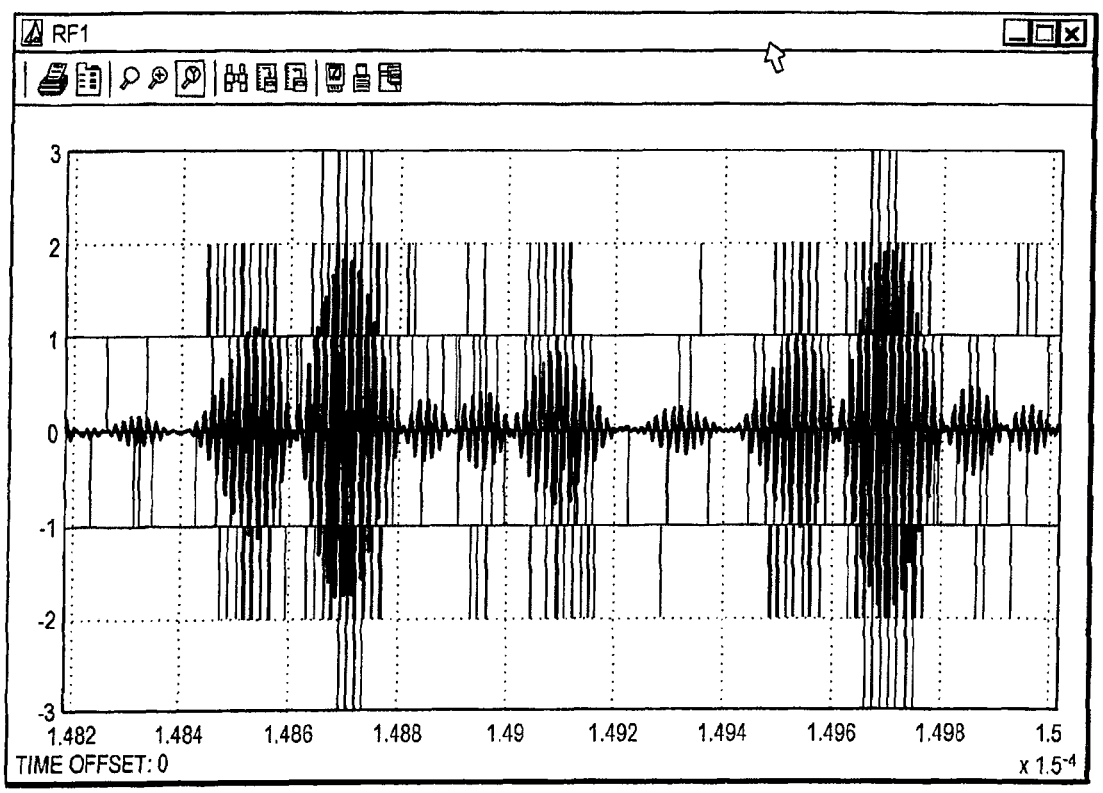
FIGS. 2D-2G show input, intermediate and recovered signals from the simulation shown in FIG. 2C.
Figure 2E:
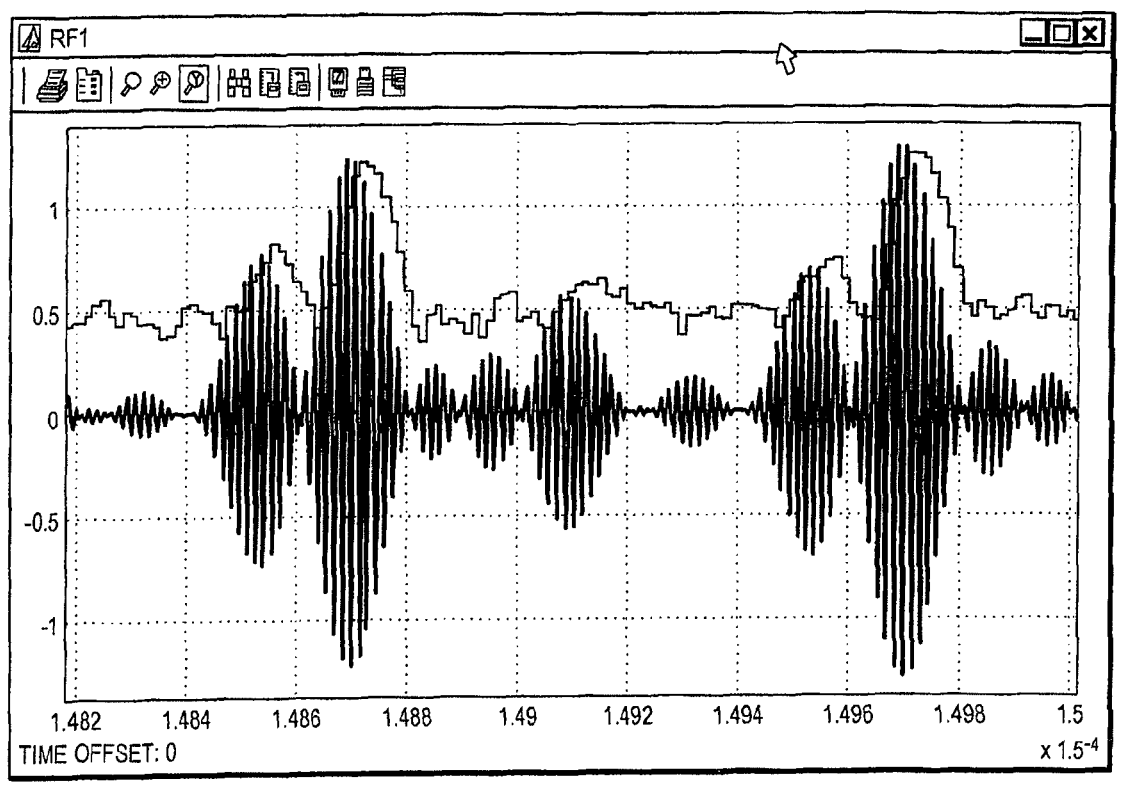

FIG. 2D shows the OFDM signal 202 (i.e., signal from the antenna), the 299 signal from ADC 300 and the overflow signal from ADC 300. The overflow signal from ADC 300 is encoded as a seven level pulse signal. That is, FIG. 2D displays the three signals labeled as 232 in FIG. 2C. FIG. 2E displays the gain signal from 233 (in analog form, there being a D/A converter not shown), the magnitude signal from AGC 216, and the signal from limiter 212, all labeled as 231 in FIG. 2C.

Figure 2F:
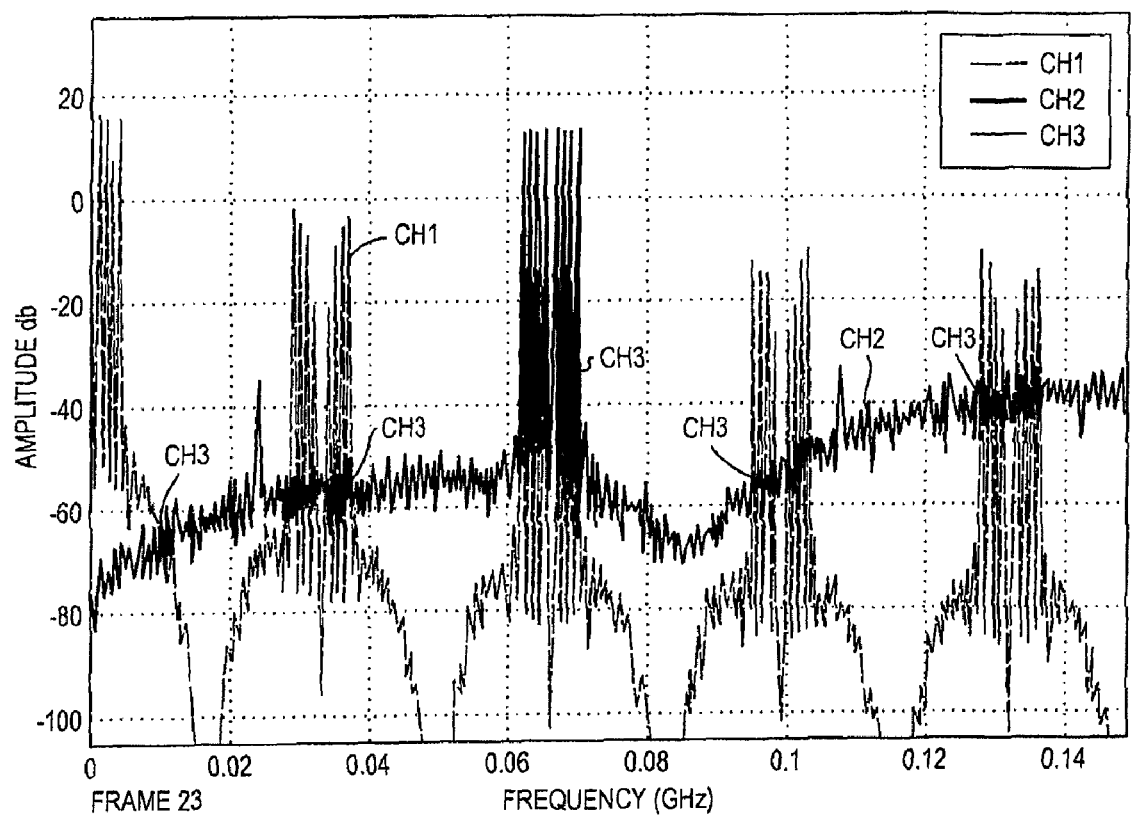
Figure 2G:
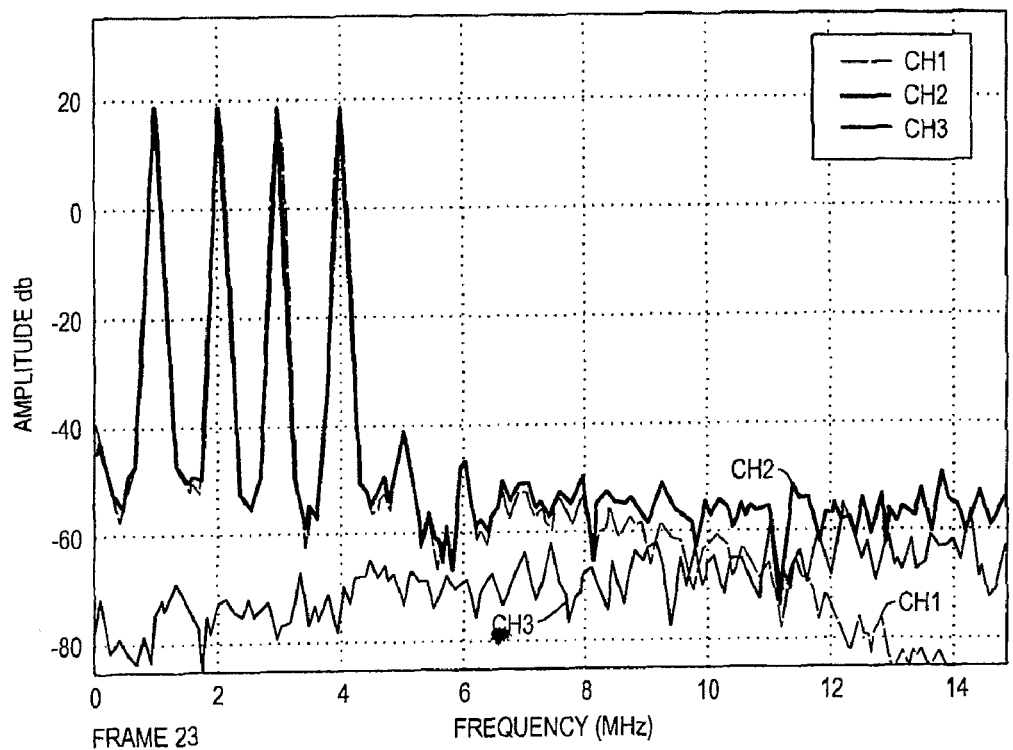

FIG. 2F shows the three signals provided to 291. That is, FIG. 2F compares the OFDM signal (channel 1), the output signal from SDM 300 (channel 2) and the decimated signal from decimator 220 (channel 3). FIG. 2G shows the three signals provided to 282 shown in FIG. 2C. That is, FIG. 2G compares the demodulated recovered signal (channel 1), the unmodulated signal 204 (channel 2) and the IF signal (channel 3).

Figure 3:
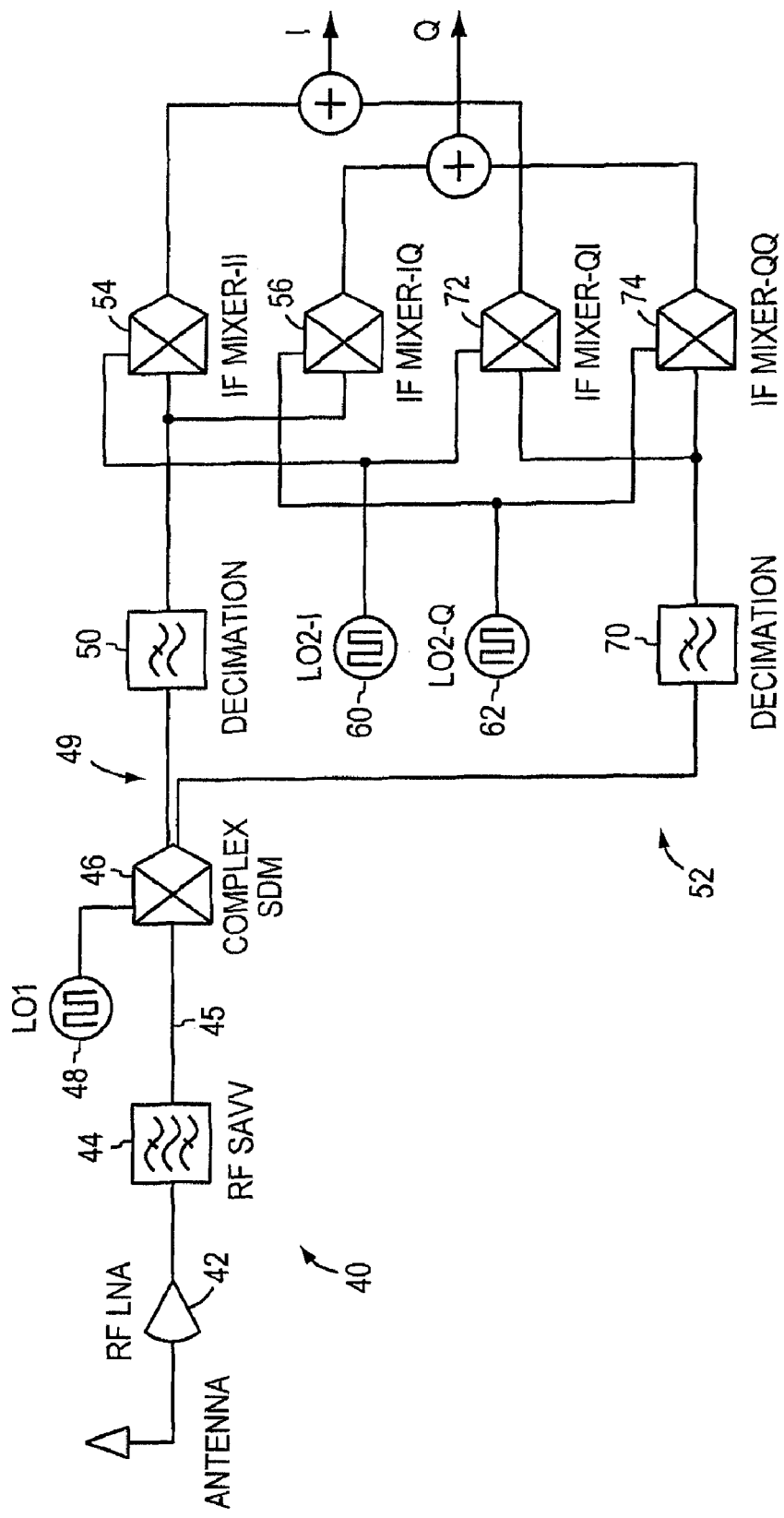
FIG. 3 illustrates a digital heterodyne circuit with Weaver image reject.

FIG. 3 illustrates schematically a heterodyne receiver 40 including a quadrature SDM 46 used to down-convert a plurality of I and Q signals using a complex noise shaping loop. Receiver 40 receives the modulated RF signal that is amplified by a low noise amplifier (LNA) 42 and provided to an optional band pass filter 44 (for example, a surface acoustic wave filter, SAW) to attenuate unwanted out of band signals. A quadrature SDM 46 receives the filtered modulated RF signal and provides quantized I and Q signals, at an intermediate frequency, having a high sample rate of 2.376 GHz and a low bit depth of 6 levels (2.5 bits). The linearity of the feedback DAC within the SDM ADC typically limits system linearity so correction methods can be used.

Figure 3A:
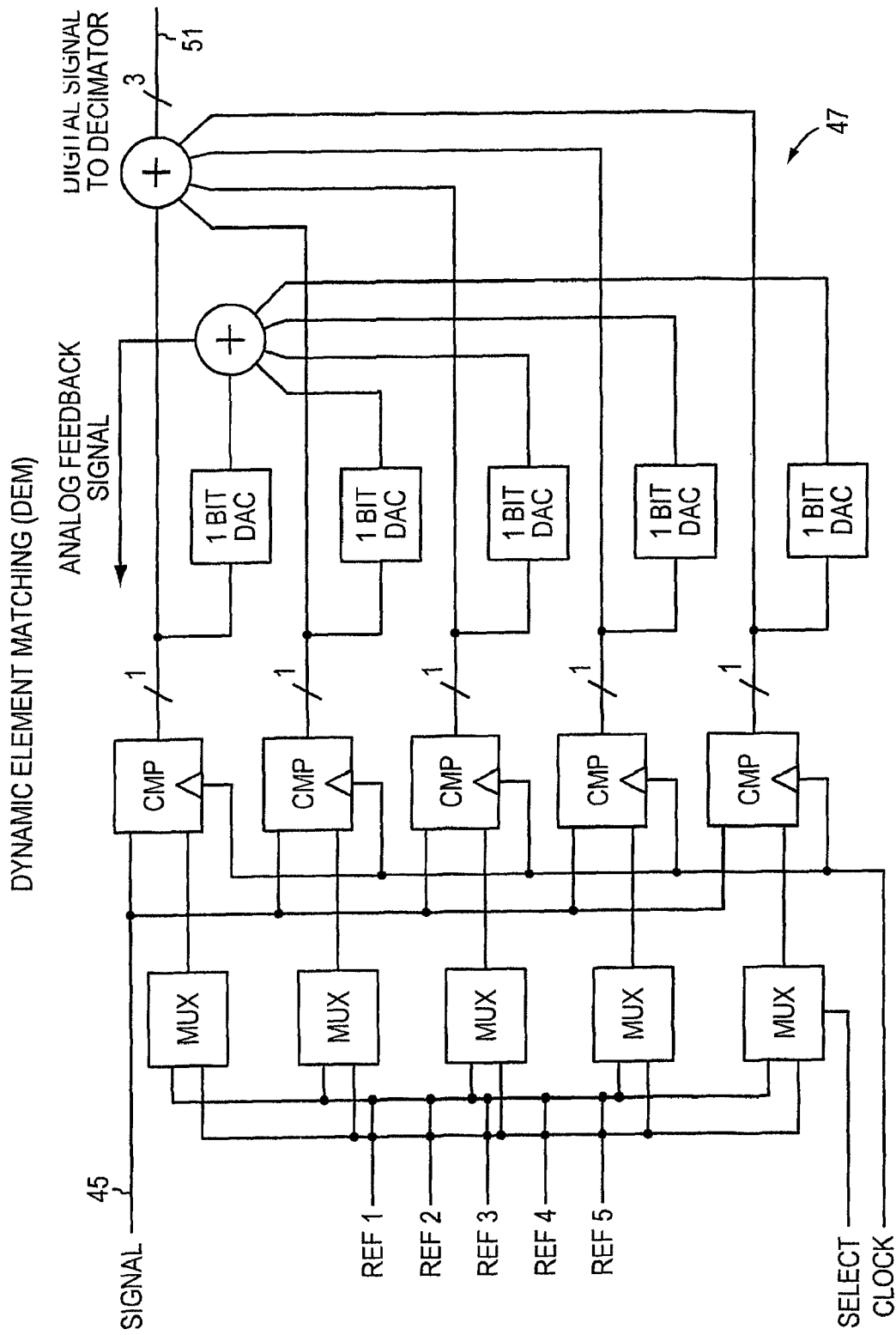
FIG. 3A is a block a Dynamic Element Matching (DEM) used with quadrature SDM, shown in FIG. 3.

FIG. 3A illustrates one embodiment of a Dynamic Element Matching (DEM) 47 used with quadrature SDM 46. According to one exemplary embodiment, DEM 47 includes a set of five multiplexers (MUX) each receiving a select signal and reference signals REF 1, REF 2, REF 3, REF 4, and REF 5. DEM 47 also includes a set of five comparators (CMP), each receiving input signal 45, a selected reference signal and a clock signal. DEM 47 also includes a set of five 1 bit DACs connected to a summing circuit providing the analog feedback signal. A second summing circuit receives the output from the five CMPs and provides its digital output signal 51 for decimation.

Dynamic Element Matching (DEM) is required in most multi-level quantized SDMs (in any application, not just transceivers) to achieve the full performance potential of the SDM ADC as determined by the designed NTF.

Furthermore, the performance of SDM 46 depends on the feedback from the used DAC to exactly match the feed forward digital path. Thus, the DAC linearity essentially limits the ADC performance, where non-linearities in the DAC are largely caused by mismatch of components, but the novel design successfully deals with these limitations.

As shown in FIG. 3A, the novel continuous time (CT) modulator system shuffles the reference inputs to the five CMPs that generate the digital thermometer code. This places the DEM in the forward signal path and allows errors in the DEM to be noise shaped by an NTF similar to the input signal 45. Since most CT modulators use clocked comparators, the references can be shuffled during the reset phase of the comparator. No additional propagation delay is added to the output of the comparators and therefore the group delay and jitter in the feedback path is minimized. This novel concept is applicable also to switch capacitor modulators or even Flash ADCs.

Specifically, DEM 47 (FIG. 3A) has one 1 bit DAC dedicated to one comparator. The comparator outputs are summed in the digital space to produce the encoded multi-bit forward output signal 51. The DACs are current summed to produce the multi-level feedback signal. The digital select signal to the analog multiplexers can be changed while the comparator is in a hold or reset state, giving the reference time to settle before the next sample clock edge is received by the comparator. To minimize any harmonic tones related to the shuffle rate being generated in the signal band, the rate of shuffling can be spread using a method such as a PN generator, noise shaping, or a data weighted averaging technique in the digital circuitry which generates the select signal. (We note that other less preferred embodiments may also be use digital logic in the feedback path to shuffle the DAC elements and therefore spread (average) the additional quantization noise caused by the non-linear DAC step size. This shuffling may be done dynamically and not as a separate calibration step.)

Referring still to FIGS. 3 and 3A, the output 51 from DEM 47 is provided to decimation filters 50 and 70, separately. Decimation filters 50 and 70 suppress quantizer noise and decimate the high sample rate, low bit depth I and Q signals. (Alternatively, receiver 40 may use a single complex decimator.) Receiver 40 also includes a Weaver style image reject mixer 52, which includes four digital mixers 54, 56, 72, and 74 receiving IF signals from two numerically controlled oscillators 60 and 62 having bit depths similar to the bit depth of the decimator output. Numerically controlled oscillators 60 and 62 are programmed to an IF frequency such as to tune a plurality of channels.

Digital decimation filters 50 and 70 may include a digital low-pass or bandpass filter and a digital decimator. Digital decimation filters 50 and 70 receive digitized amplitude density-modulated signals at an intermediate frequency, wherein the signals are separated by 90°. Each digital decimation filter produces a decimated or down-sampled digital output signal delivered to image reject mixer 52.

Referring still to FIG. 3, decimation filter 50 receives the in-phase IF signal and provides the decimated signal to mixers 54 and 56, which also receive digital sine wave signal from digital oscillator circuits 60 and 62, respectively. Furthermore, decimation filter 70 receives the quadrature IF signal and provides the decimated signal to mixers 72 and 74 that also receive digital sine wave signal from digital oscillator circuits 60 and 62, respectively.

Oscillator circuits 60 and 62 provide numerically generated sine waves of a selected frequency separated by 90°. The outputs of multipliers 54, 56 and 72 and 74 are summed and differenced to create I and Q signals with the image rejected. These tuned and image rejected signals are then potentially processed by additional decimation before being output to a digital baseband processor for demodulation.

Figure 4:
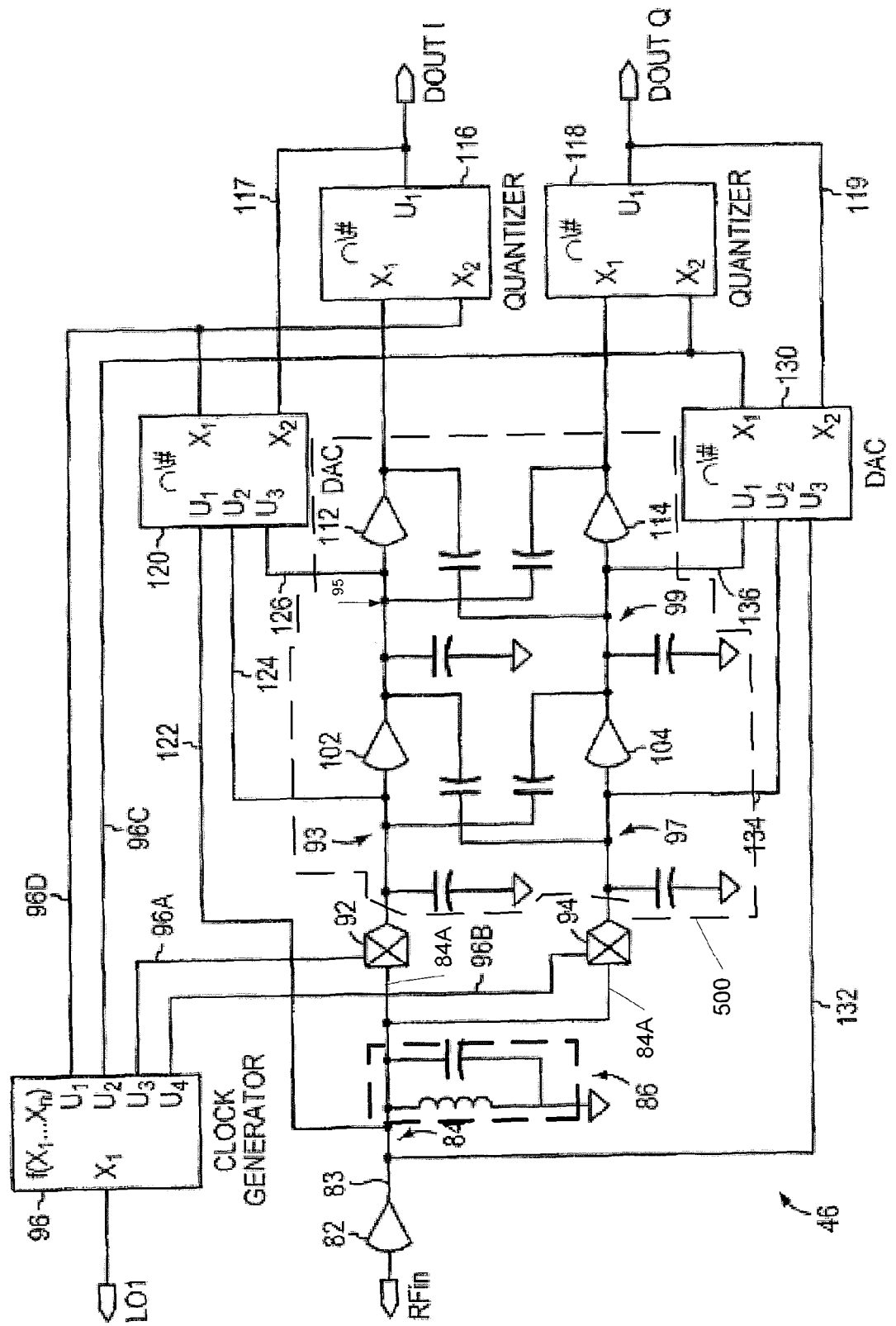
FIG. 4 illustrates a complex sigma-delta modulator constructed to provide intermediate frequency in-phase (I) and quadrature (Q) signals for the heterodyne receiver circuit of FIG. 3.

FIG. 4 illustrates a complex SDM 46 providing intermediate frequency in-phase (I) and quadrature (Q) signals used in heterodyne receiver circuit 40 shown in FIG. 3. The modulated data in the form of a continuous time signal is amplified by a current output Gm amplifier 82 and presented to an error summing node 84 (also referred to herein as summing circuit 84). (Low noise amplifier 42 (FIG. 3) may potentially be realized as Gm amplifier 82). Complex SDM 46 includes a bandpass filter 86 (also referred to herein as bandpass tank 86) providing an in-phase (I) analog signal to analog mixer 92 coupled to integrators 102 and 112 connected to an analog-to-digital converter 116. Bandpass filter 86 also provides a quadrature (Q) analog signal to analog mixer 94 coupled to integrators 104 and 114 connected to an analog-to-digital converter 118. A clock generator 96 provides a quantization signal at a sample frequency to both quantizers 116 and 118, as well as the mixing frequency to analog mixers 92 and 94. In one embodiment, the sample frequency of the quantization signal is a frequency that is comparable to the mixing frequency.

Summing node 84 effectively creates an error signal by combining the output current of Gm amplifier 82 and the output current of the SDM feedback digital-to-analog converters 120 and 130 (feed-back loops 122 and 132) within the bandpass tank 86 created by the L and C elements. The mixer inside the SDM 46 (i.e., analog mixers 92, 94) down-converts this error signal, and as such, a traditional analog IF signal is never generated. This error signal closes the SDM loop and LC filter 86 is an integral part of the noise shaping transfer function. The LC tank 86 creates poles that are typically located within the modulated signal band, much like a bandpass SDM. Multiple GmLC stages (e.g., the stage comprising Gm 82 and LC tank 86) may be cascaded for higher order loops. In operation, the circuit of FIG. 4 includes a network of elements including feedback loops 124, 126, 134 and 136, which serve as a phase shift network to form a complex noise-shaping filter 500. The feedback loops 124, 126, 134, and 136 provide for linearity of the circuit. As is known in the art and as is explained in Jantzi (which was previously incorporated by reference), complex filters, such as the complex noise-shaping filter 500 of FIG. 4, are filters having a transfer function with complex-valued coefficients (e.g., including complex poles). As Jantzi also explains, a complex pole can be created, e.g., by way of a pair cross-coupled integrators, as is illustrated in FIG. 4 with the cross-coupled integrator pairs 102, 104 and 112, 114. Thus, in one embodiment, as shown in FIG. 4, the complex SDM 46 provides noise shaping that includes a plurality of poles in the modulated frequency band (i.e., from bandpass tank filter 86, which can be implemented in multiple stages as described above, resulting in multiple poles) as well as a plurality of poles in the down-converted frequency band (which arise from the complex noise-shaping filter 500, as explained in Jantzi).

Sigma-delta modulator 46 converts the analog RF signal into a low-resolution but very high-speed digital signal DOUT 1, DOUT 2 for both I and Q, respectively. The analog input signal RF in modulates the density of states of the high speed signal. Such signals include, for example, pulse density and pulse duration modulated signals (PDM), pulse code modulation (PCM), pulse position modulation (PPM) for single-bit digital output streams, or amplitude density modulated signals (ADM) for multiple-bit digital output streams. Digital decimation filters 50 and 70 (FIG. 3) reconstruct the analog input signal in digital form. Output reduces the sampling frequency from that of the sampling clock frequency provided by clock generator 96, to a lower rate generally near the Nyquist sampling rate, with respect to the input signal bandwidth. Decimation filters 50 and 70 suppress quantizer noise outside the bandwidth of complex SDM 46. Furthermore, the filtered output signal is decimated to a lower sample rate, by selection of every N-th sample. The PDM or ADM signals contain many states over a time period corresponding to an analog input cycle at a frequency near the upper edge of the modulator or signal passband, which means that the sample rate is much higher than the highest frequency of the analog input signal. The sigma-delta processing modulates the density of quantizer states and thus makes better use of the multiple PDM or ADM samples available from SDM 46 for each output sample produced by the decimation filter. The better use is accomplished by shaping the quantization noise spectrum so that it is reduced within the same frequency band as the input signal.

Referring again to FIG. 4, the digitized I and Q outputs of SDM 46 are separately provided to the respective digital-to-analog converters DACs 120 and 130 via connections 117 and 119, respectively. DACs 120 and 130 provide analog replicas 122, 132, respectively, of the output signals DOUT1, DOUT2, respectively, to summing nodes (also referred to herein as summing circuit) 84, 93, 95, 97, and 99. In summing the circuit at summing node 84, the analog RF input signal RF in is applied to the non-inverting input port of Gm current amplifier 82, and the analog replica of the PDM output signal is applied to the inverting output of Gm current amplifier 82 via the feedback loops 122, 132. Thus, summing circuit 84 takes the difference between the actual sampled input signal RF in and the analog replica signals 122, 132 and produces a difference or error signal representing the deviation of the PDM output from the actual sampled analog input signal RF in.

Integrators 102 and 112 (and 104, 114) each receive the error signal that is summed (at nodes 93, 95, 97, and 99, respectively) with the previously accumulated signals (124, 126, 134, and 136, respectively) fed to a second non-inverting input port. The previously accumulated signal (124, 126, 134, and 136, respectively) is updated by addition of the current error signal to produce a new, updated accumulated value at the output of each integrator 102, 112, 104, 114, respectively. The new, updated, accumulated value is applied to delay elements, which delay the accumulated sum, and makes it available after the delay on output signal.

The I and Q down-converting may be formed using, for example, a sample and hold amplifier, transmission gate or balanced mixer that is enclosed within the same noise shaping loop 500, which helps to linearize the down-converter means.

Complex Sigma-delta converter 46 includes a complex noise shaping filter 500, which is responsive to both the I and Q down-converted signals. This complex noise shaping filter 500 adds additional noise shaping before quantization. For example, as explained above, the noise shaping of complex noise shaping filter 500 is performed in combination with one or more bandpass tank circuits 86, resulting in a plurality of poles in the modulated frequency band and a plurality of poles in the down-converted frequency band. The filtered signals are quantized at the quantizers 116, 118 to a plurality of digital output levels, which are both fed forward to the digital processor (e.g., the digital signal processor referenced in connection with FIG. 1A) and fed back through a plurality of DACs 120, 130 to effectively close the SDM 46 loop.

Referring again to FIG. 4, Digital-to-analog converters (DACs) 120 and 130 are connected to the GmC stages and potentially utilize DEM for higher linearity. In addition to DEM, the DACs connected to the GmLC stages either utilize return-to-zero (RTZ) or are effectively modulated at the SDM sample clock rate (e.g., via sample clock signal 96C from clock generator 96) such that the DACs 120 and 130 feed back signals 122, 132 in the modulated frequency band. In addition, the tuned LC tank 86 of the bandpass GmLC stage(s) may be retuned for different RF bands while either the Gm or C of the lowpass GmC stages may be retuned for the desired signal bandwidth.

Referring to FIGS. 3, 3A and 4, for high-speed performance, the preferred DEM method utilizes the time during which the clocked comparator is reset to shuffle which comparator is looking at which reference using analog multiplexers. Each comparator is connected to a dedicated single bit DAC for analog feedback to the SDM 46 and the digital outputs are effectively summed for feeding forward to the decimator. To prevent beat tones due to the DEM switch rate, either the mux selection order can be randomized or the frequency of rotating the selects can be randomized using the serial output of a Pseudorandom Number (PN) generator as a rotate/hold signal. Not all stages of the SDM 46 are required to have the same number of bits in the DAC feedback. There are potential linearity improvements if the very first stage is only one bit while there are potential stability and dynamic range improvements for multi-bit DACs.

There are several possible modifications of the diagram shown in FIG. 4. For example, the capacitor network may be located after the mixers to provide the input to quantizers 116 and 118. Furthermore, the analog mixers 92, 94 may include a diode sample and hold circuit.

Figure 5:
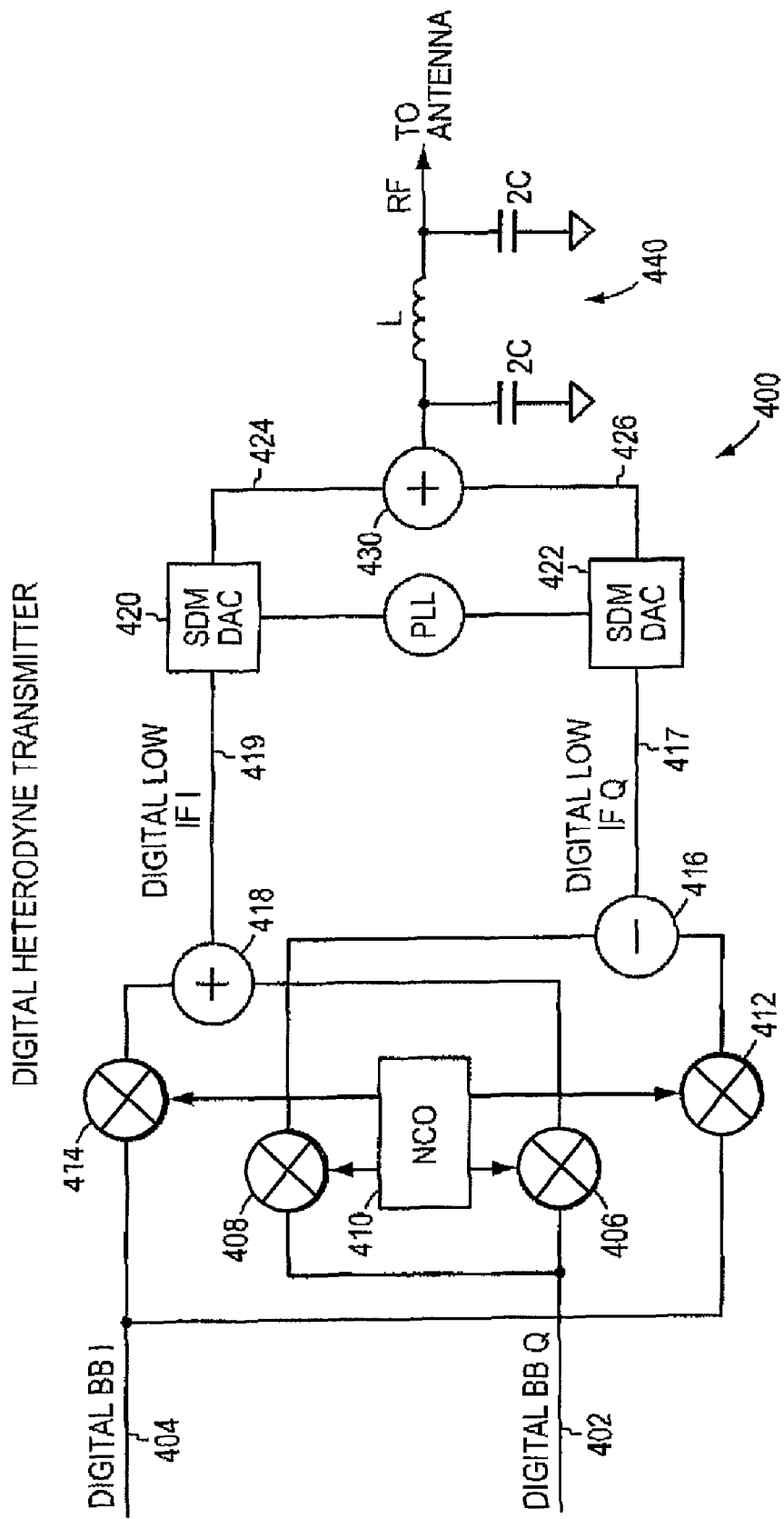
FIG. 5 is a block diagram of a digital heterodyne transmitter.

FIG. 5 is a block diagram of a digital heterodyne transmitter 400. Digital heterodyne transmitter 400 receives two digital baseband signals 402 and 404 from, for example, a modulator (not shown). Signals 402 and 404 are provided to the respective digital mixer circuits 406 and 408 (for signal 402) and 414 and 412 (for signal 404), the digital mixer circuits 406, 408, 412, 414 also receiving an IF signal from a numerically controlled oscillator (NCO) 410. Sigma-delta modulator 420 receives a digital in-phase IF signal 419 (which results, of course, because the mixers 414 and 406 mixed the digital baseband signals they received with corresponding in-phase IF signals from the NCO 410) and an RF clock signal (from the PLL shown in FIG. 5). Sigma-delta modulator 420 provides an in-phase RF analog signal 424 to a summing circuit 430. Sigma-delta modulator 422 receives a digital out-of-phase IF signal 417 (which results, of course, because the mixers 408 and 412 mixed the digital baseband signals they received with corresponding out of phase IF signals from the NCO 410) and an RF clock signal from the PLL. Sigma-delta modulator 422 provides an out-of-phase RF analog signal 426 to a summing circuit 430. Circuit 440 (which comprises the inductor L and the pair of capacitors each labeled 2C) is used for carrier tuning. In addition, as will be recognized by those of skill in the art, the illustrated configuration of the mixers 414, 408, 406, 412, the summer circuits 418 and 416, and the NCO 410 of FIG. 5 together provides a Weaver image reject mixer similar to that described previously in connection with FIG. 3.

In addition, it will be understood by those skilled in the relevant art that control and electronic elements and functional elements of the invention and various structures may vary in many ways from the described above. Numerous other embodiments, and modifications thereof, are contemplated as falling within the scope of the present invention as defined by appended claims and equivalents thereto.

Additional embodiments are within the following claims:

The invention claimed is:

1. A heterodyne transmitter constructed and arranged to receive a discrete time digital baseband input signal and convert it to a continuous time modulated signal at a radio frequency (RF) carrier frequency, the heterodyne transmitter comprising:

a first sampling circuit constructed and arranged to receive the discrete time digital baseband input signal and to increase the sampling rate of the discrete time digital baseband input signal so as to produce a first interpolated signal, wherein the discrete time digital baseband input signal comprises digitized in-phase (I) and quadrature (Q) signals;

a digital mixer responsive to the first interpolated signal and to a first digital mixing signal at a first mixing frequency, the digital mixer producing a digital signal at an intermediate carrier frequency representative of the discrete time digital baseband input signal;

a second sampling circuit constructed and arranged to receive from the digital mixer the digital signal at an intermediate carrier frequency representative of the discrete time digital baseband input signal and to increase the sampling rate of the digitized signal at the intermediate carrier frequency representative of the discrete time digital baseband input signal so as to produce a second interpolated signal at the intermediate carrier frequency; and a sigma-delta modulator (SDM) digital to analog converter (DAC) receiving the second interpolated signal at the intermediate carrier frequency and an RF sampling signal, the SDM DAC constructed and arranged to process the digitized I and Q signals together in a complex noise-shaping filter having cross coupling between the I and Q signal paths and having a transfer function with complex-valued coefficients, so as to provide complex noise shaping of the digitized I and Q signals at the RF carrier frequency and produce a modulated signal at the RF carrier frequency.

2. The heterodyne transmitter of claim 1 wherein at least one of the first and second sampling circuits is constructed and arranged to up sample the digital signal it receives so as to ensure that, in the modulated signal at the RF carrier frequency, any aliased versions of a desired signal inherent in the original discrete time digital baseband input signal are offset from the digital signal received at the respective sampling circuit by a distance sufficient to enable the aliased version of the desired signal to be filtered from the modulated signal at the RF carrier frequency.

3. The heterodyne transmitter of claim 1, further comprising a reconstruction filter constructed and arranged to receive the modulated signal at the RF carrier frequency and to filter at least a portion of any aliased versions of the desired signal and attenuate the SDM noise shaping.

4. The heterodyne transmitter of claim 1 wherein the first mixing frequency is selected to correlate with the frequency of a first predetermined communications channel.

5. The heterodyne transmitter of claim 1, further comprising a first frequency generator that generates the first digital mixing signal at the first mixing frequency.

6. The heterodyne transmitter of claim 5, wherein the first frequency generator provides a programmable first digital mixing signal at the first mixing frequency, such that the first mixing frequency is able to be selected to correlate with the frequency of a desired communications channel.

7. The heterodyne transmitter of claim 5, wherein the first frequency generator comprises a frequency generator constructed and arranged to generate the first digital mixing signal using at least one of lookup tables, Cordic techniques, and using a numerically controlled oscillator.

8. The heterodyne transmitter of claim 1, wherein:
the digital mixer further comprises first, second, third, and fourth digital mixers, that are constructed and arranged to receive a first oscillator signal LO1I and a second oscillator signal LO1Q, wherein, LO1I and LO1Q are shifted about 90 degrees out of phase, so as to create a digital version of a Weaver style image reject mixer architecture, the Weaver architecture performing quadrature sampling using the first oscillator signal LO1I and a second oscillator signal LO1Q and producing digital I and Q signals each at an intermediate carrier frequency representative of the digital baseband input signal.

9. The heterodyne transmitter of claim 1, where the complex noise-shaping filter of the SDM DAC further comprises complex integrators, such that the heterodyne transmitter is constructed and arranged to process the digitized I and Q signals together to create complex noise shaping.

10. The heterodyne transmitter of claim 1, wherein the RF sampling signal comprises an RF signal at a fixed frequency and having low phase noise.

11. The heterodyne transmitter of claim 1, wherein the SDM DAC comprises a multi-bit SEM DAC with dynamic element matching (DEM).

12. The heterodyne transmitter of claim 1, wherein the complex noise-shaping filter of the SDM DAC further comprises a plurality of continuous time integrators to perform complex noise shaping.

13. A method of converting a discrete time digital baseband input signal to a continuous time modulated signal at a radio frequency (RF) carrier frequency, the method comprising:
receiving the discrete time digital baseband input signal, wherein the discrete time digital baseband input signal comprises digitized in-phase (I) and quadrature (Q) signals;
increasing the sampling rate of the discrete time digital baseband input signal so as to produce a first interpolated I signal and a first interpolated Q signal;
mixing each of the first interpolated I and Q signals with a first digital mixing signal at a first mixing frequency so as to produce corresponding I and Q a digital signals each at an intermediate carrier frequency representative of the corresponding discrete time digital baseband input I and Q signals;
increasing the sampling rate of each of the digitized I and Q signals at the intermediate carrier frequency representative of the discrete time digital baseband input signal so as to produce corresponding a second interpolated I and Q signals at the intermediate carrier frequency;
performing complex SDM noise shaping of the second interpolated I and Q signals at the RF carrier frequency, wherein the complex SDM noise shaping includes processing of the digitized I and Q signals together in a complex noise-shaping filter having cross coupling between the I and Q signal paths and having a transfer function with complex-valued coefficients; and
generating, based on the noise-shaped second interpolated I and Q signals at the intermediate carrier frequency and an RF sampling signal, a modulated signal at the RF carrier frequency.

14. The method of claim 13, wherein generating the modulated signal at the RF carrier frequency further comprises sigma-delta modulation.

15. The method of claim 13, further comprising filtering the modulated signal at the RF carrier frequency so as to filter at least a portion of any aliased versions of the desired signal and so as to attenuate the SDM complex noise-shaping.

16. The method of claim 13, further comprising selecting the first mixing frequency to correlate with the frequency of a first predetermined communications channel.

17. The method of claim 13, wherein:
mixing each of the first interpolated I and Q signals further comprises providing first, second, third and fourth mixers, such that the first interpolated I signal is provided to the first and second mixers and the first interpolated Q signal is provided to the third and fourth mixers; and
providing the first digital mixing signal at a first mixing frequency further comprises providing the first digital mixing signal as in in-phase signal at a first mixing frequency to the first and third mixers and providing a second digital mixing signal identical to the first digital mixing signal but 90 degrees out of phase with the first digital mixing signal to the second and fourth mixers; and further comprising:
summing together the outputs of the first and third mixers and summing together the outputs of the second and fourth mixers, so as to create a hybrid implementation of a Weaver Image Reject Mixer that produces the corresponding I and Q digital signals each at the intermediate carrier frequency representative of the corresponding discrete time digital baseband input I and Q signals; and wherein the complex SDM noise shaping of the second interpolated I and Q signals further comprises providing two sigma-delta modulators (SDMs) in parallel with local oscillator signals about 90 degrees out-of-phase, to receive the digitized I and Q signals responsive to the I and Q modulated input signals, wherein the SDMs further comprise quantized in-phase (I) and out-of-phase (Q) outputs and a plurality of multi-hit digital local oscillators (Los).

18. A heterodyne transmitter for converting a discrete time digital baseband signal to a continuous time modulated signal, the heterodyne transmitter comprising:

a digital mixer constructed and arranged to receive a digital data stream processed by a digital signal processor, the digital data stream comprising digitized in-phase (I) and quadrature (Q) signals, and to receive a first digital signal at a mixing frequency, the digital mixer being constructed to provide digital signals at an intermediate frequency being representative of a baseband signal;

a frequency generator, including a local oscillator; and a sigma-delta modulator (SDM) digital-to-analog converter (DAC) constructed and arranged to receive the digital signals at the intermediate frequency and to provide a modulated signal at an RF carrier frequency, wherein the SDM DAC is constructed and arranged to process the digitized I and Q signals together in a complex-noise shaping filter having cross-coupling between the I and Q signal paths and having a transfer function with complex-valued coefficients, so as to provide complex noise-shaping on the received digital signals, and wherein the SDM DAC further comprises a sampler for receiving, from the frequency generator a second digital signal at a mixing frequency, the sampler also providing an output signal at the RF carrier frequency.

19. The heterodyne transmitter of claim 18, wherein the sampler comprises a mixer.

20. The heterodyne transmitter of claim 18, wherein the second digital signal at a mixing frequency comprises a sampling signal.

* * * * *